(12) United States Patent
Baskaran et al.

(10) Patent No.: US 12,319,810 B2
(45) Date of Patent: Jun. 3, 2025

(54) ENHANCED DIRECTED SELF-ASSEMBLY IN THE PRESENCE OF LOW $T_g$ OLIGOMERS FOR PATTERN FORMATION

(71) Applicant: Merck Patent GmbH, Darmstadt (DE)

(72) Inventors: Durairaj Baskaran, Bridgewater, NJ (US); Victor Monreal, Breinigsville, PA (US)

(73) Assignee: Merck Patent GmbH, Darmstadt (DE)

( * ) Notice: Subject to any disclaimer, the term of this patent is extended or adjusted under 35 U.S.C. 154(b) by 773 days.

(21) Appl. No.: 17/419,847

(22) PCT Filed: Jan. 15, 2020

(86) PCT No.: PCT/EP2020/050856
§ 371 (c)(1),
(2) Date: Jun. 30, 2021

(87) PCT Pub. No.: WO2020/148305
PCT Pub. Date: Jul. 23, 2020

(65) Prior Publication Data
US 2022/0010125 A1    Jan. 13, 2022

Related U.S. Application Data

(60) Provisional application No. 62/943,326, filed on Dec. 4, 2019, provisional application No. 62/793,436, filed on Jan. 17, 2019.

(51) Int. Cl.
*C08L 53/00* (2006.01)
*C08F 297/02* (2006.01)
(Continued)

(52) U.S. Cl.
CPC ......... *C08L 53/00* (2013.01); *C08F 297/026* (2013.01); *C09D 153/00* (2013.01);
(Continued)

(58) Field of Classification Search
CPC ....... C09D 153/00; C08L 53/00; C08L 25/14; C08L 33/04
See application file for complete search history.

(56) References Cited

U.S. PATENT DOCUMENTS 8,513,356 B1    8/2013  Sharma et al.
9,676,934 B2    6/2017  Senzaki et al.
(Continued)

FOREIGN PATENT DOCUMENTS

FR    3014876 B1    3/2017
FR    3031748 B1    9/2018
(Continued)

OTHER PUBLICATIONS

Claudy et al Polymer Bulletin 9 208-215 (Year: 1983).*
(Continued)

*Primary Examiner* — Mark S Kaucher
(74) *Attorney, Agent, or Firm* — EMD Performance Materials Corp.

(57) ABSTRACT

The present invention relates to a composition comprising components a), b) and c). The component a) is a block copolymer or a blend of block copolymers. The component b) is a low $T_g$ additive selected from the group consisting of an oligo random oligo random copolymer b-1), an oligo diblock copolymer b-2), an oligo diblock copolymer b-3) and a mixture of at least two of these. The component c) is a is a spin casting organic solvent. The invention also pertains to the use of said compositions in directed self-assembly. The invention further pertains to the novel oligo diblock copolymer b-2) which is an oligo diblock copolymer of block A-b) and block B-b), wherein block A-b) is a random copolymer of repeat units having structures (III), and (IV and block B-b) is a random copolymer of repeat units having structures (V), and (VI).

(Continued)

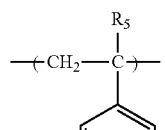

(III)

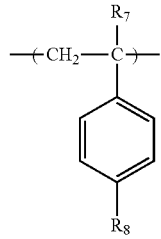

(IV)

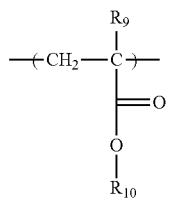

(V)

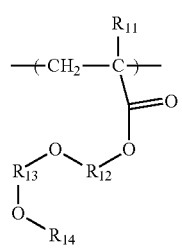

(VI)

51 Claims, 6 Drawing Sheets

Figure 1:
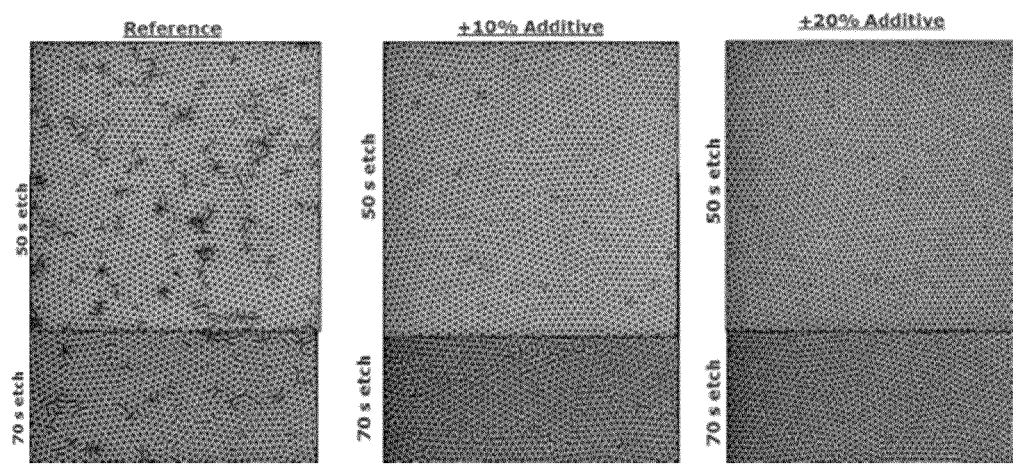

(51) Int. Cl.
    *C09D 153/00*     (2006.01)
    *G03F 7/00*     (2006.01)
    *G03F 7/36*     (2006.01)
    *H01L 21/027*     (2006.01)
    *H01L 21/3065*     (2006.01)
    *H01L 21/308*     (2006.01)

(52) U.S. Cl.
    CPC .............. *G03F 7/0002* (2013.01); *G03F 7/36* (2013.01); *H01L 21/0271* (2013.01); *H01L 21/3065* (2013.01); *H01L 21/308* (2013.01); *C08L 2205/025* (2013.01); *C08L 2205/03* (2013.01)

(56) References Cited

U.S. PATENT DOCUMENTS

2008/0233435 A1* 9/2008 Hasegawa ............. G03F 7/0002 428/339
2015/0030971 A1* 1/2015 Navarro ................ G03F 7/0002 430/5
2016/0168001 A1* 6/2016 Demott ................ C03B 5/2356 432/13
2016/0186001 A1 6/2016 Hustad et al.
2016/0186003 A1 6/2016 Hustad et al.
2016/0291461 A1 10/2016 Yoshida et al.
2016/0319158 A1 11/2016 Fleury et al.
2018/0015645 A1 1/2018 Chevalier et al.
2018/0164679 A1 6/2018 Chevalier et al.

FOREIGN PATENT DOCUMENTS

| FR | 3031750 B1 | 9/2018 |
|---|---|---|
| JP | 2008231233 A | 10/2008 |
| JP | 2013-166933 A | 8/2013 |
| JP | 2015-061905 A | 4/2015 |
| JP | 5934565 B2 | 5/2016 |
| JP | 2016-138245 A | 8/2016 |
| JP | 2018-502967 A | 2/2018 |
| JP | 2019-172806 A | 10/2019 |
| KR | 10-0938565 B1 | 1/2010 |
| TW | I557166 B | 11/2016 |
| TW | I598383 B | 9/2017 |
| TW | I631170 B | 8/2018 |
| WO | 2020/148305 A1 | 7/2020 |

OTHER PUBLICATIONS

Brandrup et al The polymer Handbook 4th Edition (Year: 1999).*
Beevers et al. Trans. Faraday Soc., 1960, 56, 744-752 (Year: 1960).*
Office Action received for Chinese Patent Application No. 202080008010.3 mailing date Jan. 4, 2024, 21 Pages (12 pages of English Translation Pages & 09 Pages of Official Copy).
Office Action received for Japanese Patent Application No. 2021-541212 mailing date Feb. 7, 2024, 5 Pages (3 Page of English translation and 2 pages of official copy).
Kim, B. H. et al., "Anomalous rapid defect annihilation in self-assembled nanopatterns by defect melting", Nano Letters, vol. 15, No. 2, Jan. 15, 2015, pp. 1190-1196.
Liu, C. C. et al., "Fabrication of lithographically defined chemically patterned polymer brushes and mats", Macromolecules, vol. 44, No. 7, Mar. 18, 20211, pp. 1876-1885.
International Preliminary Report on Patentability received for PCT Application No. PCT/EP2020/050856 mailing date Jul. 29, 2021, 13 Pages.
Encyclopedia of Polymer Science and Technology, Fourth Edition, vol. 7, 2014, pp. 625-648.
International Search Report and Written Opinion received in PCT Application No. PCT/EP2020/050856 mailed on Jun. 29, 2020, 17 Pages.
Bang et al., "Facile Routes to Patterned Surface Neutralization Layers for Block Copolymer Lithography", Advanced Materials, vol. 19, Issue 24, 2007, pp. 4552-4557.
Beevers R.B. , "Physical properties of vinyl polymers", Part 4-Glass-transition temperature of methyl methacrylate + styrene copolymers, Transactions of the Faraday Society, vol. 58, 1962, pp. 1465-1472.
Beldie et al., "Glass transition temperatures of some copolymers of styrene with methyl methacrylate using DTA and chromatographic data", European Polymer Journal, vol. 21 Issue 3, 1985, pp. 321-323.
Bong Hoon Kim et al., "Anomalous Rapid Defect Annihilation in Self-Assembled Nanopatterns by Defect Melting", Supporting Information, 2015, 13 pages.
Bong Hoon Kim et al., "Anomalous Rapid Defect Annihilation in Self-Assembled Nanopatterns by Defect Melting", Nano Letters, vol. 15, No. 2, 2015, pp. 1190-1196.
Fan et al., "Glass transition temperatures of copolymers from methyl methacrylate, styrene, and acrylonitrile: binary copolymers", Polymer Bulletin vol. vol. 67, Issue 11, 2011, pp. 1311-1323.
Ham et al., "Role of Triad Concentration in Glass Transition Temperatures of Copolymers. II", Journal of Macromolecular Science: Part A—Chemistry, vol. 9, Issue 7, 1975, pp. 1281-1287.

(56) References Cited

OTHER PUBLICATIONS

Hawker et al., "Initiating Systems for Nitroxide-Mediated "Living" Free Radical Polymerizations: Synthesis and Evaluation", Macromolecules vol. 29 No. 16, Jul. 29, 1996, pp. 5245-5254.

Ji et al., "Preparation of Neutral Wetting Brushes for Block Copolymer Films from Homopolymer Blends", Advanced materials, vol. 20 issue 16, Aug. 2008, pp. 3054-3060.

Kruger et al., "Trilayer Resist", Chapter 5, VLSI Electronics Microstructure Science, vol. 8, 1984, pp. 91-136.

Li et al., "Defect Removal in the Course of Directed Self-Assembly is Facilitated in the Vicinity of the Order-Disorder Transition", Physical Review Letters 113, Oct. 2014, pp. 168301-1-168301-5.

Liu et al., "Glass-transition temperatures and rheological behavior of methyl methacrylate-styrene random copolymers", Journal of Applied Polymer Science, vol. 88 Issue 13, 2003, pp. 2891-2896.

Mansky et al., "Controlling Polymer-Surface Interactions with Random Copolymer Brushes", Science, vol. 275, Issue 5305, Mar. 7, 1997, pp. 1458-1460.

Pang et al., "Directed Self-Assembly of Styrene-Methyl Acrylate Block Copolymers with Sub-7 nm Features via Thermal Annealing", Macromolecules, vol. 52 No. 8, Apr. 4, 2019, pp. 2987-2994.

Park et al., "Thickness and composition dependence of the glass transition temperature in thin random copolymer films", Polymer, vol. 45 No. 13, Jun. 2004, pp. 4507-4513.

Rastogi et al., "Etch considerations for directed self-assembly patterning using capacitively coupled plasma", Journal of Vacuum Science & Technology A, vol. 36 No. 3, 2018, pp. (031301)1-11.

Schluter et al., "Block Copolymers by Multi-Mode Polymerizations", Synthesis of Polymers, vol. 1, 2014, pp. 315-349.

Stoykovich et al., "Directed Assembly of Block Copolymer Blends into Nonregular Device-Oriented Structures", Science Magazine, vol. 308, Issue 5727, Jun. 3, 2005, pp. 1442-1446.

Stuen et al., "Graphoepitaxial assembly of asymmetric ternary blends of block copolymers and homopolymers", Nanotechnology, vol. 21 No. 49, 2010, 8 pages.

Suzuki et al., "Effects of sequence length distribution on heat capacity and glass transition temperature of styrene-methyl methacrylate copolymers", Polymer, vol. 35 No. 17, 1994, pp. 3698-3702.

Tonelli Alane. , "Intramolecular Interactions as the Source of Sequence Distribution-Glass Transition Effects and Dilute Solution Properties of Styrene-Methyl Methacrylate Copolymers", Macromolecules, vol. 10, No. 3, 1977, pp. 633-635.

Uhrig et al., "Techniques in High-Vacuum Anionic Polymerization", Journal of Polymer Science: Part A: Polymer Chemistry, vol. 43, Issue 24, 2005, pp. 6179-6222.

Xiaofeng et al., "Polymer Synthesis with More Than One Form of Living Polymerization Method", Macromolecular Rapid Communications, vol. 39, Issue 20, Sep. 20, 2018, 20 pages.

"Data on DIAD Triads MMAs", Data for first table taken from Journal of Applied Polymer Science, Second data table taken from Polymer Bulletin, Table 1—2003 & Table 2—2011, p. 1.

Tsitsilianis, et al. "Conformational transition of block copolymers in dilute solution and their morphology in the solid state", Department of Chemical Engineering, Makromol. Chem., vol. 191 No. 10, 1990, pp. 2309-2318.

Rempp, et al. "Macromolecular Engineering by Anionic Methods", Advances in Polymer Science book series, Polymer, vol. 86, Mar. 5, 1987, pp. 145-173.

Office Action received for Japanese Patent Application No. 2021-541212 mailing date Jul. 10, 2024, 8 Pages (5 pages of English translation and 3 pages of Official Copy).

\* cited by examiner

+ 10% Additive     + 20% Additive 50 s Etch

ENHANCED DIRECTED SELF-ASSEMBLY IN THE PRESENCE OF LOW $T_g$ OLIGOMERS FOR PATTERN FORMATION

This application is a national stage application, filed under 35 U.S.C. § 371, of International Patent Application No. PCT/EP2020/050856, filed on Jan. 15, 2020, which claims the benefit of U.S. Provisional Patent Application No. 62/793,436, filed Jan. 17, 2019, and U.S. Provisional Patent Application No. 62/943,326, filed Dec. 4, 2019, each of which applications is incorporated herein by reference in their entirety.

FIELD OF THE INVENTION

The invention relates to a block copolymer and block copolymer compositions and novel methods for using the block copolymer compositions for aligning microdomains of self-assembling block copolymers (BCP) to form self-assembled geometries which are useful for forming arrays of contact holes or lines and spaces. These compositions and processes are useful for fabrication of electronic devices.

BACKGROUND

Self-assembly of block copolymers is a method useful for generating smaller and smaller patterned features for the manufacture of microelectronic devices in which the critical dimensions (CD) of features on the order of nanoscale can be achieved. Self-assembly methods are desirable for extending the resolution capabilities of microlithographic technology for repeating features such as an array of contact holes or posts. In a conventional lithography approach, ultraviolet (UV) radiation may be used to expose through a mask onto a photoresist layer coated on a substrate or layered substrate. Positive or negative photoresists are useful, and these can also contain a refractory element such as silicon to enable dry development with conventional integrated circuit (IC) plasma processing. In a positive photoresist, UV radiation transmitted through a mask causes a photochemical reaction in the photoresist such that the exposed regions are removed with a developer solution or by conventional IC plasma processing. Conversely, in negative photoresists, UV radiation transmitted through a mask causes the regions exposed to radiation to become less removable with a developer solution or by conventional IC plasma processing. An integrated circuit feature, such as a gate, via or interconnect, is then etched into the substrate or layered substrate, and the remaining photoresist is removed. When using conventional lithographic exposure processes, the dimensions of features of the integrated circuit feature are limited. Further reduction in pattern dimensions are difficult to achieve with radiation exposure due to limitations related to aberrations, focus, proximity effects, minimum achievable exposure wavelengths and maximum achievable numerical apertures. The need for large-scale integration has led to a continued shrinking of the circuit dimensions and features in the devices. In the past, the final resolution of the features has been dependent upon the wavelength of light used to expose the photoresist, which has its own limitations. Directed (a.k.a. guided) self-assembly techniques, such as graphoepitaxy and chemoepitaxy using block copolymer imaging, which employ a patterned area on a substrate, are highly desirable techniques used to enhance resolution while reducing CD variation. These techniques can be employed to either enhance conventional UV lithographic techniques or to enable even higher resolution and CD control in approaches employing EUV, e-beam, deep UV or immersion lithography. The directed self-assembly block copolymer comprises a block of etch resistant copolymeric unit and a block of highly etchable copolymeric unit, which when coated, aligned and etched on a substrate give regions of very high-density patterns.

For directed (guided), or unguided self-assembly, of a block copolymer film, respectively, on a patterned or non-patterned substrate area, typically the self-assembly process of this block polymer layer occurs during annealing of this film overlying a neutral layer. This neutral layer over a semiconductor substrate may be an unpatterned neutral layer, or in chemoepitaxy or graphoepitaxy, this neutral layer may contain, respectively, graphoepitaxy or chemoepitaxy guiding features (formed through the above described UV lithographic technique). During annealing of the block copolymer film, the underlying, neutral layer, directs the nano-phase separation of the block copolymer domains. One example is the formation phase separated domains which are lamellas or cylinders perpendicular to the underlying neutral layer surface. These nano-phase separated block copolymer domains, form a pre-pattern (e.g. line and space L/S) which may be transferred into the substrate through an etching process (e.g. plasma etching). In graphoepitaxy, or in chemoepitaxy, these guiding features may dictate both pattern rectification and pattern multiplication. In the case of an unpatterned neutral layer this produces a repeating array of for instance L/S or CH. For example, in a conventional block copolymer such as poly(styrene-b-methyl methacrylate (P(S-b-IMMA)), in which both blocks have similar surface energies at the BCP-air interface, this can be achieved by coating and thermally annealing the block copolymer on a layer of non-preferential or neutral material that is grafted or cross-linked at the polymer-substrate interface.

In the graphoepitaxy directed self-assembly method, the block copolymers self organizes around a substrate that is pre-patterned with conventional lithography (Ultraviolet, Deep UV, e-beam, Extreme UV (EUV) exposure source) to form repeating topographical features such as a line/space (L/S) or contact hole (CH) pattern. In an example of a L/S directed self-assembly array, the block copolymer can form self-aligned lamellar regions which can form parallel line-space patterns of different pitches in the trenches between pre-patterned lines, thus enhancing pattern resolution by subdividing the space in the trench between the topographical lines into finer patterns. For example, a diblock copolymer or a triblock copolymer which is capable of microphase separation and comprises a block rich in carbon (such as styrene or containing some other element like Si, Ge, Ti) which is resistant to plasma etch, and a block which is highly plasma etchable or removable, can provide a high-resolution pattern definition. Examples of highly etchable blocks can comprise monomers which are rich in oxygen and which do not contain refractory elements and are capable of forming blocks which are highly etchable, such as methyl methacrylate. The plasma etching gases used in the etching process of defining the self-assembly pattern typically are those used in processes employed to make integrated circuits (IC). In this manner, very fine patterns can be created in typical IC substrates than were definable by conventional lithographic techniques, thus achieving pattern multiplication. Similarly, features such as contact holes can be made denser by using graphoepitaxy in which a suitable block copolymer arranges itself by directed self-assembly around an array of contact holes or posts defined by conventional lithography, thus forming a denser array of regions of etchable and etch resistant domains which when etched give rise to a denser array of contact holes. Consequently, graphoepitaxy has the potential to offer both pattern rectification and pattern multiplication.

In chemical epitaxy, or pinning chemical epitaxy, the self-assembly of the block copolymer is formed on a surface whose guiding features are regions of differing chemical affinity, having no, or insignificant topography (a.k.a. non-guiding topography) which predicates the directed self-assembly process. For example, the surface of a substrate could be patterned with conventional lithography (UV, Deep UV, e-beam EUV) to create surfaces of different chemical affinity in a line and space (L/S) pattern in which exposed areas whose surface chemistry had been modified by irradiation alternate with areas which are unexposed and show no chemical change. These areas present no topographical difference but do present a surface chemical difference or pinning to direct self-assembly of block copolymer segments. Specifically, the directed self-assembly of a block copolymer whose block segments contain etch resistant (such as styrene repeat unit) and rapidly etching repeat units (such as methyl methacrylate repeat units) would allow precise placement of etch resistant block segments and highly etchable block segments over the pattern. This technique allows for the precise placement of these block copolymers and the subsequent pattern transfer of the pattern into a substrate after plasma or wet etch processing. Chemical epitaxy has the advantage that it can be fined tuned by changes in the chemical differences to help improve line-edge roughness and CD control, thus allowing for pattern rectification. Other types of patterns such as repeating contact holes (CH) arrays could also be pattern rectified using chemoepitaxy.

These neutral layers are layers on a substrate or the surface of a treated substrate which have no affinity for either of the block segment of a block copolymer employed in directed self-assembly. In the graphoepitaxy method of directed self-assembly of block copolymer, neutral layers are useful as they allow the proper placement or orientation of block polymer segments for directed self-assembly which leads to proper placement of etch resistant block polymer segments and highly etchable block polymer segments relative to the substrate. For instance, in surfaces containing line and space features which have been defined by conventional radiation lithography, a neutral layer allows block segments to be oriented so that the block segments are oriented perpendicular to the surface of the substrates, an orientation which is ideal for both pattern rectification and pattern multiplication depending on the length of the block segments in the block copolymer as related to the length between the lines defined by conventional lithography. If a substrate interacts too strongly with one of the block segments it would cause it to lie flat on that surface to maximize the surface of contact between the segment and the substrate; such a surface would perturb the desirable perpendicular alignment which can be used to either achieve pattern rectification or pattern multiplication based on features created through conventional lithography. Modification of selected small areas or pinning of substrate to make them strongly interactive with one block of the block copolymer and leaving the remainder of the surface coated with the neutral layer can be useful for forcing the alignment of the domains of the block copolymer in a desired direction, and this is the basis for the pinned chemoepitaxy or graphoepitaxy employed for pattern multiplication.

Although self-assembly using polystyrene-b-polymethylmethacrylate (PS-b-PMMA) is widely used as next generation patterning material in lithography, with the nano-phase separation assembly process generates well aligned arrays of domains this occurs with the formation of considerable amounts of defects, if the film thickness exceeds beyond 50 nm. These defects are significant in contact hole and line/space multiplication processes and need to be reduced significantly to improve device yield in any commercially viable IC-manufacturing employing directed self-assembly. One of the origins of the defects is an insufficient diffusion of block segments that generates defects such as dislocation, bridges, networks and line or cylinder collapse etc. Thus, there is a need for new materials and processes which can affect directed self-assembly even in such thick films. We have found a number of low $T_g$ oligomeric materials, which can be used as additives forming novel block copolymer composition, which are able to affect self-assembly of block copolymer domains having a greatly reduced number of these defects even in film thickness beyond 50 nm.

DETAILED DESCRIPTION OF DRAWINGS

FIG. 1 Top Down SEM Contact Hole Array Study of Self Assembled Films of Block Copolymer of Styrene and Methyl Methacrylate with and without oligo(S-co-MMA) additive [Synthesis Example 5]: Film Thickness 50 nm (~1 $L_o$); film cast on film of Neutral Layer. The neutral layer was formed by casting Neutral Formulation Example 1 (74% PS) on a silicon wafer and baking it at 240° C./5 min followed by a rinse for 30 s with PGMEA, and a bake 110° C. for 1 min. Films of Formulations 1 to 3 (Form. Ex. 1 to 3), contained 1.5 wt. % solids in PGMEA, and comprised, a blend of P(S-b-MMA) and 0 to 20 wt. % in PGMEA of oligo(S-co-MMA) (listed in Table 1) were spun at 1500 rpm on top of this neutral layer to form a film (Lo=45.3/FT 50 nm) which was then baked at 250° C. for 5 min under Nitrogen to affect self-assembly and etched with an oxygen plasma for 50 and 70 seconds.

Figure 2:
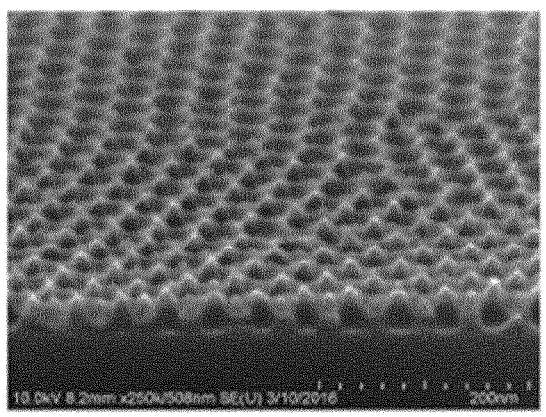
Figure 2:
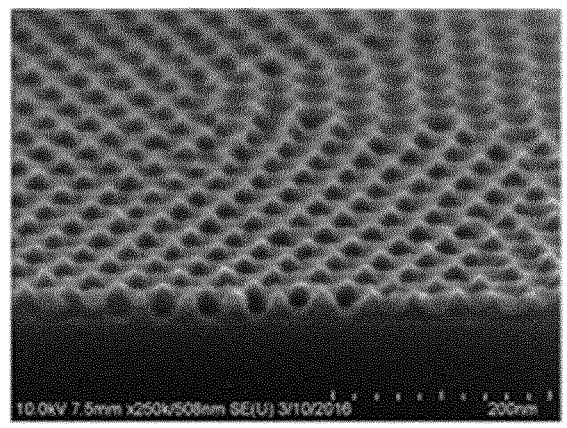

FIG. 2 X-Section SEM, Contact Hole Array Study of Self Assembled Films of Block Copolymer of Styrene and Methyl Methacrylate with and without oligo(S-co-MMA) additive [Synthesis Example 5]: Film Thickness 50 nm (~1 $L_o$); film cast on film of Neutral Layer. The neutral layer was formed by casting Neutral Formulation Example 1 (74% PS) on a silicon wafer and baking it at 240° C./5 min followed by a rinse for 30 s with PGMEA, and a bake 110° C. for 1 min. Films of Formulations 2 and 3 (Form. Ex. 2 and 3), (listed in Table 1) contained 1.5 wt. % solids in PGMEA, and comprised, a blend of P(S-b-MMA) and 10 to 20 wt. % in PGMEA of oligo(S-co-MMA) (listed in Table 1) were spun at 1500 rpm on top of this neutral layer to form a film (Lo=45.3/FT 50 nm) which was then baked at 250° C. for 5 min under Nitrogen to affect self-assembly and etched with an oxygen plasma for 50 seconds FIG. 3 Top Down SEM Contact Hole Study of Self Assembled Films of Block Copolymer of Styrene and Methyl Methacrylate with and without Oligo(S-co-p-OS)-b-P(MMA-co-DEGMEMA) additive [Synthesis Example 8]: The film Thickness was 50 nm (~1 $L_o$); cast on a film of a neutral layer. The neutral layer was formed by casting Neutral Formulation Example 1 (74% PS) on a silicon wafer and baking it at 240° C./5 min followed by a rinse for 30 s with PGMEA, and a bake 110° C. for 1 min. Films of Formulations 1, 4 and 5 (Form. Ex. 1, 4 and 5) contained 1.5 wt. % solids in PGMEA, and comprised, a blend of P(S-b-MMA) and 0 to 20 wt. % in PGMEA of Oligo(S-co-p-OS)-b-P(MMA-co-DEGMEMA) (Synth. Ex. 8) (listed in Table 1) were spun at 1500 rpm on top of the neutral layer to form a film (Lo=45.3/FT 50 nm) which was then baked at 250° C.

for 5 min under Nitrogen to affect self-assembly and then etched with an oxygen plasma for 50 and 70 seconds.

Figure 4:
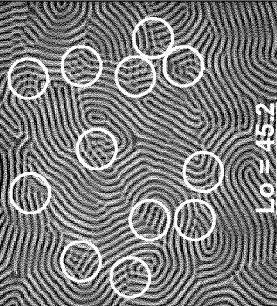

FIG. 4 Top Down SEM Line and Space Study of Self Assembled Films of Block Copolymer of Styrene and Methyl Methacrylate with and without oligo(S-co-p-OS)-b-P(MMA-co-DEGMEMA)additive [Synthesis Example 9]: Film Thickness 50 nm (~1 $L_o$); film cast on film of Neutral Layer The neutral layer was formed by casting Neutral Formulation Example 1 (74% PS) on a silicon wafer and baking it at 240° C./5 min followed by a rinse for 30 s with PGMEA, and a bake 110° C. for 1 min. Films of Formulations 6, 10, 11, and 12 (Form. Ex. 6, 10, 11 and 4) contained 1.5 wt. % solids in PGMEA, and comprised, a blend of P(S-b-MMA) and 0 to 20 wt. % in PGMEA of Oligo(S-co-p-OS)-b-P(MMA-co-DEGMEMA) (Synth. Ex. 9) (listed in Table 3) were spun at 1500 rpm on top of the neutral layer to form a film (Lo=45.3/FT 50 nm) which was then baked at 250° C. for 5 min under Nitrogen to affect self-assembly and then etched with an oxygen plasma for 50 and 70 seconds.

Figure 5:
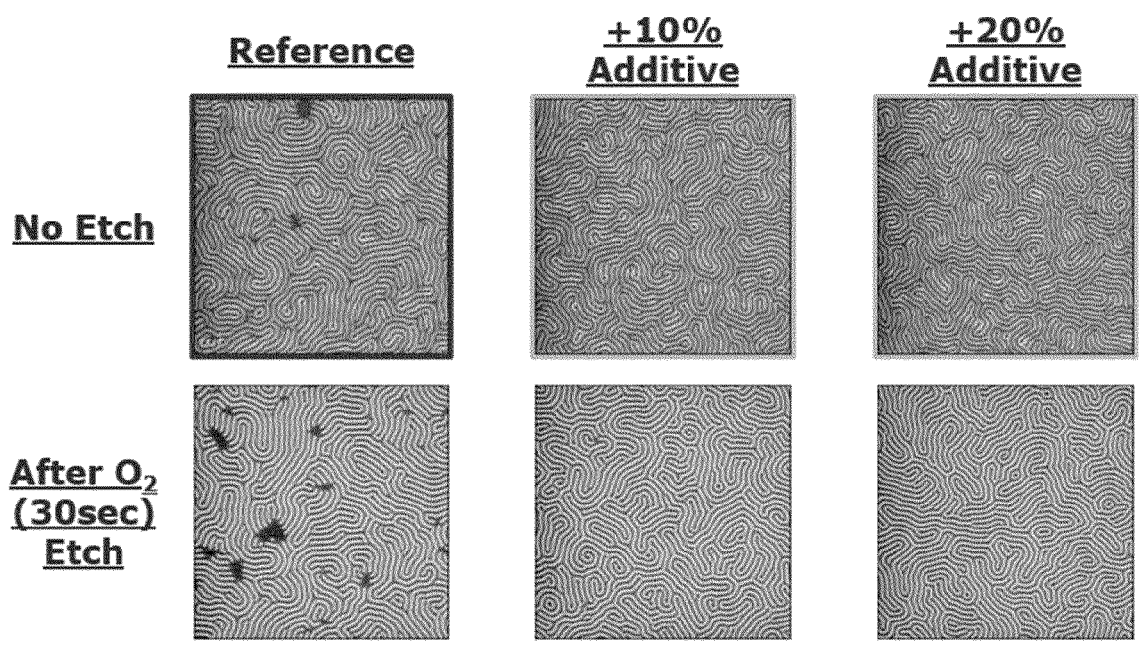

FIG. 5 Top Down SEM L/S Study of Self Assembled Films of Block Copolymer of Styrene and Methyl Methacrylate with and without Oligo(S-b-MMA) additive [Synthesis Example 8]: The film Thickness was 50 nm (~1 $L_o$); cast on a film of a neutral layer after etching with an oxygen plasma. The neutral layer was formed by casting Neutral Formulation Example 1 (74% PS) on a silicon wafer and baking it at 240° C./5 min followed by a rinse for 30 s with PGMEA, and a bake 110° C. for 1 min. Films of Formulations 6 (0 wt. %), 13 (10 wt. %), and 14 (20 wt. %) (Form. Ex. 6, 13, and 14) contained 1.5 wt. % solids in PGMEA, the block copolymer P(S-b-MMA) P(S-b-MMA) (42K-47K) and 0 to 20 wt. % in PGMEA of Oligo(S-b-MMA)- (Synth. Ex. 7) (listed in Table 3) were spun at 1500 rpm on top of the neutral layer to form a film (Lo=45.3/FT 50 nm) which was then baked at 250° C. for 5 min under Nitrogen to affect self-assembly and then etched with an oxygen plasma for 30 seconds.

Figure 6:
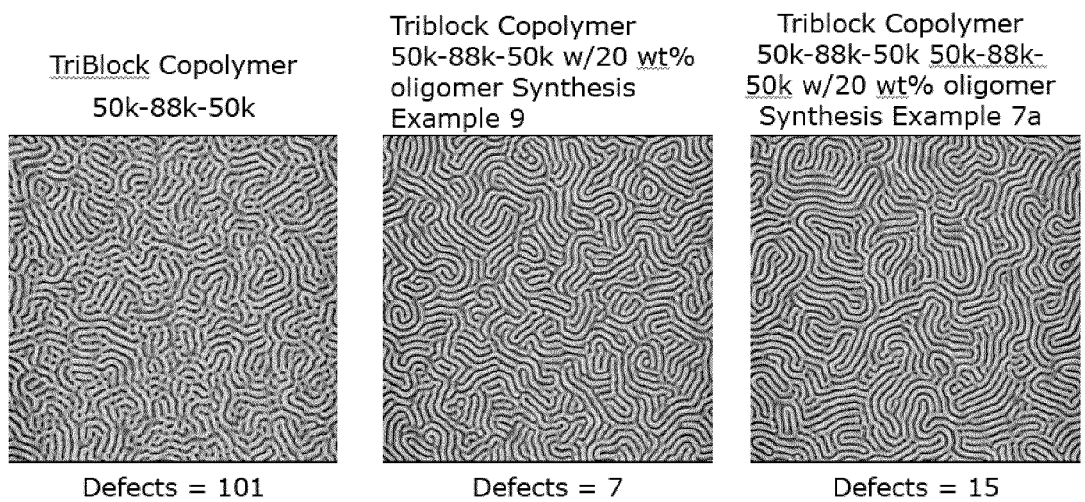

FIG. 6. Top down SEM L/S Study of Self Assembled Films of triblock copolymer Comparative Formulation 4 [Synthesis Example 4a (50K-88k-50k)] without oligomer, Formulation Example 15 with 20 wt % oligomer Synthesis Example 9, or with 20 wt % oligomer Synthesis Example 7a.

SUMMARY OF INVENTION

One aspect of the present invention relates to a composition comprising components a), b) and c), wherein a) is a block copolymer component or blend of at least two block copolymers, b) is a low $T_g$ additive selected from the group consisting of an oligo random copolymer b-1), an oligo diblock copolymer b-2), an oligo diblock copolymer b-3) and mixture thereof wherein b-1), b-2) and b-3), as follows, and c) is a spin casting solvent:

b-1) is an oligo random copolymer, of two repeat units, which have structure (Ib) and structure (IIb), wherein $R_{1b}$ and $R_{3b}$ are independently selected from H or a C-1 to C-4 alkyl, $R_{2b}$ is H or a C-1 to C-8 alkyl, $R_{4b}$ is a C-1 to C-8 alkyl, and the mole % values, based on the total moles of repeat units of structures (Ib) and (IIb), are for the repeat units of structure (Ib) from about 40 mole % to about 80 mole % and for the repeat units of structure (IIb) from about 20 mole % to about 60 mole %, and wherein the individual values of the mole % for the repeat units of structures (Ib) and (IIb) are selected from their respective ranges to add up to 100 mole % of the total moles of repeat units of structures (Ib) and (IIb); and further said oligo random copolymer b-1) has a $T_g$ which is from about 0° C. to about 80° C., and has an $M_n$ which is from about 1000 g/mole to about 8,000 g/mole, and has a polydispersity from about 1.3 to about 1.8,

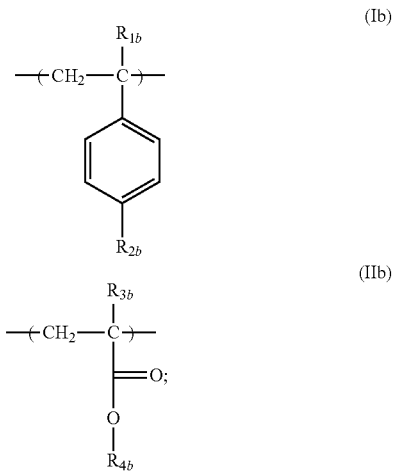

b-2) is an oligo diblock copolymer of block A-b) and block B-b), having an $M_n$ from about 1,000 to 35,000, and a polydispersity from 1.0 to about 1.1, wherein block A-b) is a random copolymer of repeat units having structures (III), and (IV), and block B-b) is a random copolymer of repeat units having structures (V), and (VI), and $R_5$, $R_7$, $R_9$, and $R_{11}$, are independently selected from H or a C-1 to C-4 alkyl, $R_6$ is a C-7 to C-10 linear alkyl, $R_8$ is a C-1 to C-4 alkyl, $R_{10}$ is a C-1 to C-4 alkyl, $R_{12}$ and $R_{13}$ are individually selected from a C-2 to C-5 alkylene, and $R_{14}$ is a C-1 to C-4 alkyl, and said oligo diblock copolymer b-2) has a $T_g$ which has a value from about 0° C. to about 95° C.

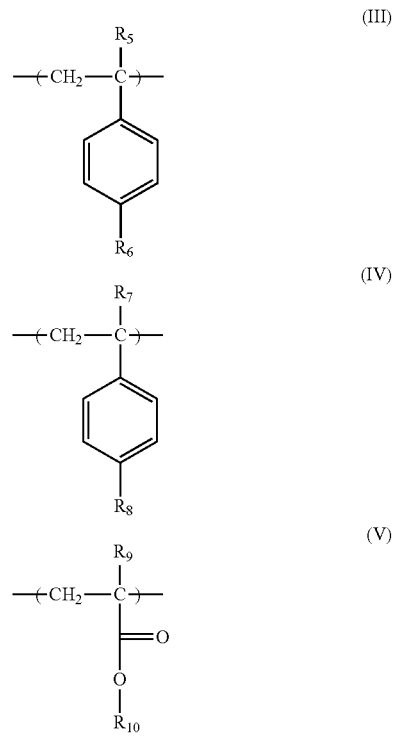

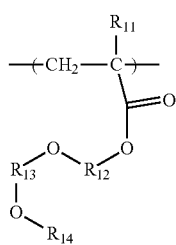

(VI)

b-3) Is an oligo diblock copolymer of block A-c), with repeat units having structure (Ic), and a block B-c), with repeat units having structure (IIc), wherein $R_{1c}$ and $R_{3c}$ are independently selected from H or a C-1 to C-4 alkyl, $R_{2c}$ is H or a C-1 to C-8 alkyl, $R_{4c}$ is a C-1 to C-8 alkyl, and the mole % values, based on the total moles of repeat units of structures (Ic) and (IIc), are for the repeat units of structure (Ic) from about 36 mole % to about 74 mole % and for the repeat units of structure (IIc) from about 26 mole % to about 64 mole %, and the individual values of the mole % for the repeat units of structures (Ic) and (IIc) are selected from their respective ranges to add up to 100 mole % of the total moles of repeat units of structures (Ic) and (IIc), and said oligo diblock copolymer b-2) has an $M_n$ from about 1000 g/mole to about 30,000 g/mole, a polydispersity from about 1.0 to about 1.1, and a $T_g$ from about 0° C. to about 115° C.

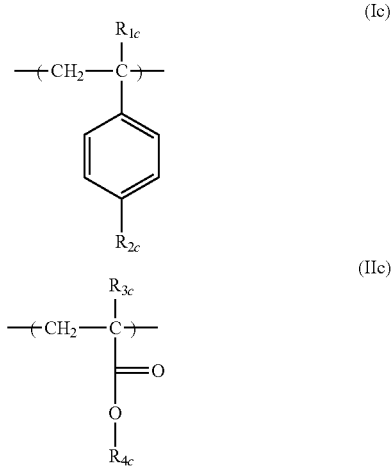

Another aspect of this invention is the method of using the above described compositions in a self-assembly process followed by pattern transfer of the self-assembled pattern into a substrate.

Another aspect still of this invention is the novel oligo diblock copolymer b-2) with block A-b) and block B-b) as described above.

DETAILED DESCRIPTION OF THE INVENTION

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms such as "includes" and "included", is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The term C-1 to C-4 alkyl embodies methyl and C-2 to C-4 linear alkyls and C-3 to C-4 branched alkyl moieties, for example as follows: methyl (—CH$_3$), ethyl (—CH$_2$—CH$_3$), n-propyl (—CH$_2$—CH$_2$—CH$_3$), isopropyl (—CH(CH$_3$)$_2$, n-butyl (—CH$_2$—CH$_2$—CH$_2$—CH$_3$), tert-butyl (—C(CH$_3$)$_3$), isobutyl (CH$_2$—CH(CH$_3$)$_2$, 2-butyl (—CH(CH$_3$)CH$_2$—CH$_3$). Similarly, the term C-1 to C-8 embodies methyl C-2 to C-8 linear, C-3 to C-8 branched alkyls, C-4 to C-8 cycloalkyls (e.g. cyclopentyl, cyclohexyl etc) or C-5-C-8 alkylenecycloalkyls (e.g. —CH$_2$-cyclohexyl, CH$_2$—CH$_2$-cyclopentyl etc.

The term C-2 to C-5 alkylene embodies C-2 to C-5 linear alkylene moieties (e.g. ethylene, propylene etc.) and C-3 to C-5 branched alkylene moieties (e.g. —CH(CH$_3$)—, —CH(CH$_3$)—CH$_2$—, etc.).

Di-block and triblock copolymers of styrenic and acrylic moieties useful as components in the inventive compositions described herein may be made by a variety of methods, such as anionic polymerization, atom transfer radical polymerization (ATRP), Reversible addition-fragmentation chain transfer (RAFT) polymerization, living radical polymerization and the like (Macromolecules 2019, 52, 2987-2994; Macromol. Rapid Commun. 2018, 39, 1800479; A. Deiter Shluter et al Synthesis of Polymers, 2014, Volume 1, p 315; Encyclopedia of Polymer Science and Technology, 2014, Vol 7, p 625.)

The random copolymer poly(styrene-co-methyl methacrylate) is abbreviated as "P(S-co-MMA)," and the oligomeric version of this materials is abbreviated oligo(S-co-MMA). Similarly the block copolymer poly(styrene-block-methyl methacrylate) is abbreviated as P(S-b-MMA), while the oligomer of this material is abbreviated as oligo(S-b-MMA). The oligomer oligo(styrene-co-p-octylstyrene)-block-(methyl methacrylate-co-di(ethylene glycol) methyl ether methacrylate) uses the same abbreviations to designate random an block copolymer elements, specifically oligo(S-co-p-OS)-b-P(MMA-co-DEGMEMA), in which S=styrene, p-OS=para-octylstyrene, MMA=methacrylate, DEGMEMA=di(ethylene glycol) methyl ether methacrylate designate the repeat units in this block copolymer whose two blocks are random copolymers.

The term "g/mole," is an abbreviation of grams per mole.

FOV is the abbreviation for field of view for top down scanning electron micrographs (SEM) for the SEM FIGS. in this application 1, 3, 4 and 5 in this instance the field of view is 2 µm. The cross-section electron micrograph (X-SEM) shown in FIG. 2 has a magnification of 250K. The field of view. The term "CH," is an abbreviation for contact hole lithographic features, the term "L/S," is an abbreviation for line and space lithographic features.

In the following descriptions the term "Synth." is an abbreviation for synthesis; the term "Comp". is an abbreviation for comparative; and the term "Ex." is an abbreviation for Example.

The term oligomer, oligo and oligomeric polymer as used herein to denote low $T_g$ additives and denote a low molecular weight polymer whose molecular weight range is specific to the additive type as indicated herein.

The term acrylic as used herein encompasses repeat unit derived from acrylate derivatives generally for examples one derived from acrylate derivatives having the following structure, wherein the Alkyl moiety may be a C-1 to C-8 alkyl, and Xacryl is either H or a C-1 to C-4 alkyl:

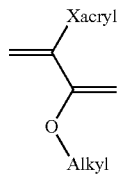

The term styrenic as used herein encompasses repeat units derived from styrene derivative generally for examples one derived from styrene derivatives having the following structure wherein Xsty moiety is H or a C-1 to C-4 alkyl and the Rsty moiety is H or a C-1 to C-8 moiety:

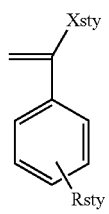

One aspect of the present invention relates to an inventive composition comprising components a), b) and c), wherein a) is a block copolymer component or blend of at least two block copolymers, b) is a low $T_g$ additive selected from the group consisting of an oligo random copolymer b-1), an oligo diblock copolymer b-2), an oligo diblock copolymer b-3) and mixture thereof wherein b-1, b-2 and b-3, as follows, and c) is a spin casting solvent:

b-1) is an oligo random copolymer, of two repeat units, which have structure (Ib) and structure (IIb), wherein $R_{1b}$ and $R_{3b}$ are independently selected from H or a C-1 to C-4 alkyl, $R_{2b}$ is H or a C-1 to C-8 alkyl, $R_{4b}$ is a C-1 to C-8 alkyl, and the mole % values, based on the total moles of repeat units of structures (Ib) and (IIb), are for the repeat units of structure (Ib) from about 40 mole % to about 80 mole % and for the repeat units of structure (IIb) from about 20 mole % to about 60 mole %, and wherein the individual values of the mole % for the repeat units of structures (Ib) and (IIb) are selected from their respective ranges to add up to 100 mole % of the total moles of repeat units of structures (Ib) and (IIb); and further, said oligo random copolymer b-1) has a $T_g$ which is from about 0° C. to about 80° C., and has an $M_n$ which is from about 1000 g/mole to about 8,000 g/mole, and has a polydispersity from about 1.3 to about 1.8.

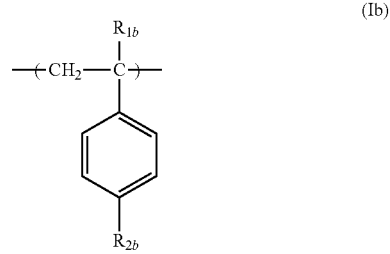

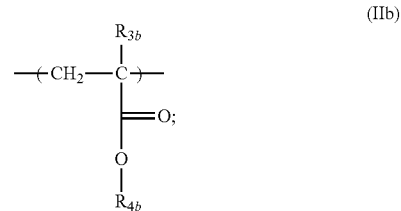

b-2) is an oligo diblock copolymer of block A-b) and block B-b), having an $M_n$ from about 1,000 to 35,000, and a polydispersity from 1.0 to about 1.1, wherein block A-b) is a random copolymer of repeat units having structures (III), and (IV), and block B-b) is a random copolymer of repeat units having structures (V), and (VI), and $R_5$, $R_7$, $R_9$, and $R_{11}$, are independently selected from H or a C-1 to C-4 alkyl, $R_6$ is a C-7 to C-10 linear alkyl, $R_8$ is a C-1 to C-4 alkyl, $R_{10}$ is a C-1 to C-4 alkyl, $R_{12}$ and $R_{13}$ are individually selected from a C-2 to C-5 alkylene, and $R_{14}$ is a C-1 to C-4 alkyl, and said oligo diblock copolymer b-2) has a $T_g$ which has a value from about 0° C. to about 95° C.

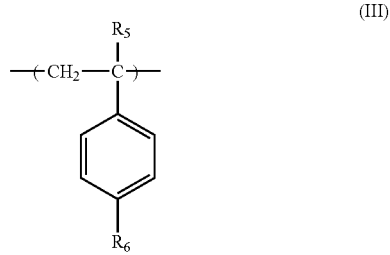

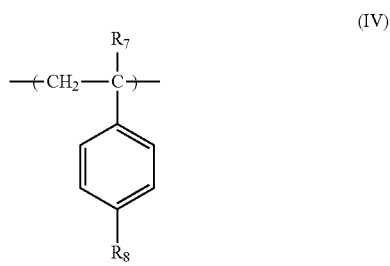

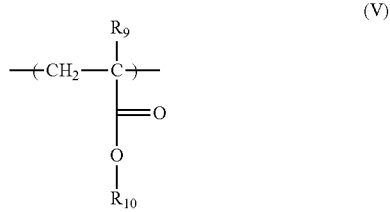

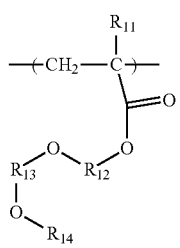

b-3) is an oligo diblock copolymer of block A-c), with repeat units having structure (Ic), and a block B-c), with repeat units having structure (IIc), wherein $R_{1c}$ and $R_{3e}$ are independently selected from H or a C-1 to C-4 alkyl, $R_{2e}$ is H or a C-1 to C-8 alkyl, $R_4$, is a C-1 to C-8 alkyl. And the mole % values, based on the total moles of repeat units of structures (Ic) and (IIc), are for the repeat units of structure (Ic) from about 36 mole % to about 74 mole % and for the repeat units of structure (IIc) from about 26 mole % to about 64 mole %, and the individual values of the mole % for the repeat units of structures (Ic) and (IIc) are selected from their respective ranges to add up to 100 mole % of the total moles of repeat units of structures (Ic) and (IIc), and said oligo diblock copolymer b-2) has an $M_n$ from about 1000 g/mole to about 30,000 g/mole, a polydispersity from about 1.0 to about 1.1, and a $T_g$ from about 0° C. to about 115° C.

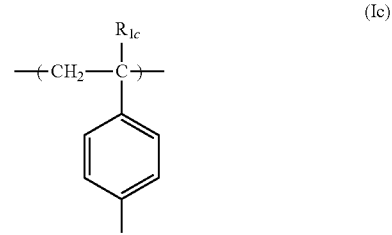

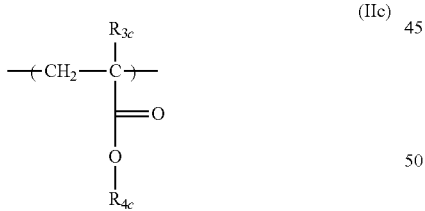

Another aspect of the inventive composition comprising components a), b) and c), described herein, is an embodiment wherein said component a) is selected from either a single triblock copolymer and blends of at least two triblock copolymers, or a single diblock copolymer and blends of at least two diblock copolymers.

Component a) is a Triblock Copolymer

Another aspect of the inventive composition described comprising components a), b) and c), is an embodiment wherein said component a) is an ABA triblock copolymer component selected from the group consisting of an ABA triblock copolymer a-1t), an ABA triblock copolymer a-2t), and a blend of ABA triblock polymer a-1t) and ABA triblock copolymer a-2t).

In the above embodiment a-1t) is an ABA triblock copolymer, comprising a middle B styrenic block segment of repeat units having styrenic structure (I), and two end acrylic block A) segments of equal length having structure (II), wherein $R_1$ and $R_3$ are independently selected from H and C-1 to C-4 alkyl, $R_2$ is H or a C-1 to C-8 alkyl, $R_4$ is a C-1 to C-8 alkyl. Further, in this embodiment the mole % values, based on the total moles of repeat units of structures (I) and (II), are for the repeat units of structure (I) from about 40 mole % to about 80 mole % and for the repeat units of structure (II) from about 20 mole % to about 60 mole %, wherein the individual values of the mole % for the repeat units of structures (I) and (II) are selected from their respective ranges to add up to 100 mole % of the total moles of repeat units of structures (I) and (II), and said triblock copolymer a-1t) has a polydispersity from about 1.0 to about 1.1 and has an $M_n$ from about 70,000 g/mole to about 350,000 g/mole. In one aspect of this embodiment the moiety $R_2$ is attached through a para linkage the aromatic ring of the styrenic moiety.

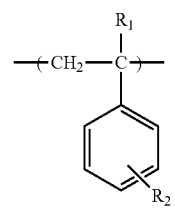

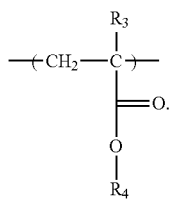

In the above embodiment a-2t) is an ABA triblock copolymer, comprising a middle B) block segment of repeat units having acrylic structure (Ia), and two end block B) segments of equal length having styrenic structure (IIa), wherein $R_{1a}$ and $R_{3a}$ are independently selected from H and C-1 to C-4 alkyl, $R_{2a}$ is H or a C-1 to C-8 alkyl, $R_{4a}$ is a C-1 to C-8 alkyl, the mole % values, based on the total moles of repeat units of structures (Ia) and (IIa), are for the repeat units of structure (Ia) from about 40 mole % to about 80 mole % and for the repeat units of structure (IIa) from about 20 mole % to about 60 mole %, and wherein the individual values of the mole % for the repeat units of structures (Ia) and (IIa) are selected from their respective ranges to add up to 100 mole % of the total moles of repeat units of structures (Ia) and (IIa), and said triblock copolymer a-2t) has a polydispersity from about 1.0 to about 1.1, has an $M_n$ from about 70,000 g/mole to about 350,000 g/mole. In one aspect of this embodiment the moiety $R_{2a}$ is attached through a para linkage to the aromatic ring of the styrenic moiety.

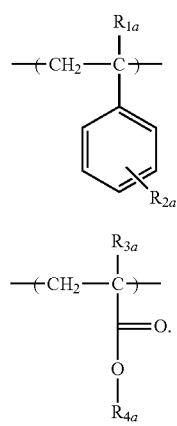
(Ia)

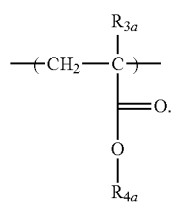
(IIa)

In another aspect of the inventive composition wherein components a) is an ABA triblock copolymer chosen from a-1t), a-2t) or a blend of these in the repeat units of structures (I), (II), (Ia), and (IIa). In another aspect of this embodiment $R_{1a}$, $R_2$ and $R_{2a}$ are H and $R_3$, $R_{3a}$, $R_4$, and $R_{4a}$ are independently selected from C-1 to C-4 alkyl. In yet another aspect of this embodiment. In another aspect of this embodiment $R_{1a}$, $R_2$ and $R_{2a}$ are H and $R_3$, $R_{3a}$, $R_4$, and $R_{4a}$ are methyl. In yet another aspect of this embodiment $R_1$, $R_{1a}$, $R_2$ and $R_{2a}$ are H and $R_3$, $R_{3a}$, $R_4$, and $R_{4a}$ are methyl.

In another aspect of the inventive composition wherein components a) is an ABA triblock copolymer it is a triblock copolymer selected from a triblock copolymer of structure (ABA-1), a triblock copolymer of structure (ABA-2) and a mixture of these two block copolymers. In this embodiment mt, mta, nt and nta are the number of repeat units, $R_{1s}$, $R_{1sa}$, $R_{2s}$, and $R_{2sa}$ are independently selected from hydrogen, a C-1 to C-8 alkyl, —N$(R_{3s})_2$, —O$R_{4s}$, and Si$(R_{5s})_3$, wherein $R_{3s}$, $R_{4s}$ and $R_{5s}$ are independently selected from a C-1 to C-4 alkyl. In a more specific aspect of this embodiment $R_1$, $R_{1a}$, $R_2$, $R_{2a}$ and $R_{1s}$ and $R_{2s}$ are H and $R_3$, $R_{3a}$, $R_4$, and $R_{4a}$ are individually selected from a C-1 to C-4 alkyl. In another more specific aspect of this embodiment $R_1$, $R_{1a}$, $R_2$, $R_{2a}$ and $R_{1s}$ and $R_{2s}$ are H and $R_3$, $R_{3a}$, $R_4$, and $R_{4a}$ methyl.

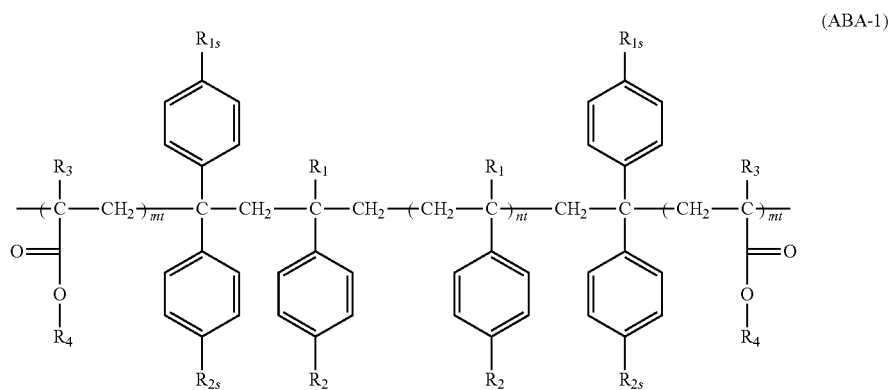
(ABA-1)

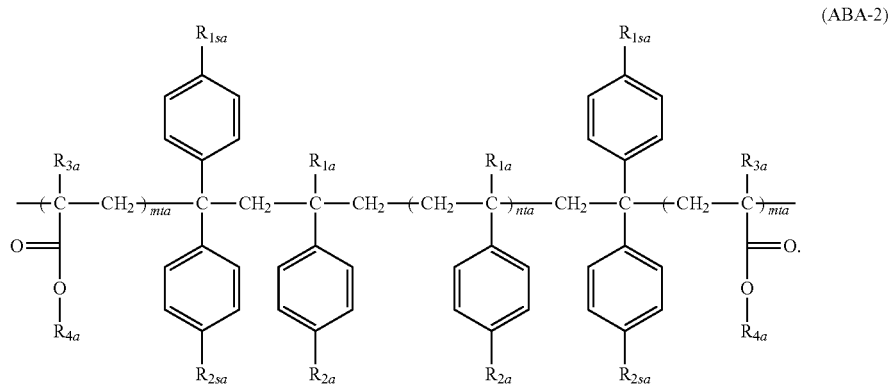
(ABA-2)

Component a) is a Diblock Polymer

In another aspect of the inventive composition described herein component a) is a diblock copolymer or a blend of at least two diblock copolymer. In one aspect of this embodiment it is selected the group consisting of diblock copolymer a-1), diblock copolymer a-2) and a blend of a-1) and a-2) which are as follows:

a-1) is a diblock copolymer of block A), with repeat units having structure (I), and block B), with repeat units having structure (II), wherein $R_1$ and $R_3$ are independently selected from H and C-1 to C-4 alkyl, $R_2$ is H or a C-1 to C-8 alkyl, $R_4$ is a C-1 to C-8 alkyl. Further, the mole % values, based on the total moles of repeat units of structures (I) and (II), are for the repeat units of structure (I) from about 40 mole % to about 80 mole % and for the repeat units of structure (II) from about 20 mole % to about 60 mole %. Further still the individual values of the mole % for the repeat units of structures (I) and (II) are selected from their respective ranges to add up to 100 mole % of the total moles of repeat units of structures (I) and (II), and said diblock copolymer a-1) has a polydispersity from about 1.0 to about 1.1 and has an $M_n$ from about 50,000 g/mole to about 150,000 g/mole. In one aspect of this embodiment the moiety $R_2$ is attached through a para linkage to the aromatic ring of the styrenic moiety.

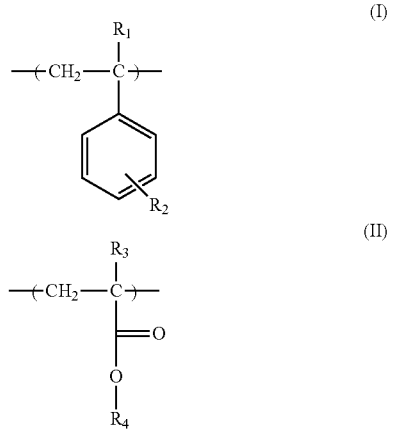

a-2) is a di-block copolymer of a block A-a), with repeat units having structure (Ia), and block B-a), with repeat units having structure (IIa). $R_{1a}$ and $R_{3a}$ are independently selected from H or a C-1 to C-4 alkyl, $R_{2a}$ is H or a C-1 to C-8 alkyl, $C_{4a}$ is a C-1 to C-8 alkyl. The mole % values, based on the total moles of repeat units of structures (Ia) and (IIa), are for the repeat units of structure (Ia) from about 40 mole % to about 80 mole % and for the repeat units of structure (IIa) from about 20 mole % to about 60 mole %. Further, the individual values of the mole % for the repeat units of structures (Ia) and (IIa) are selected from their respective ranges to add up to 100 mole % of the total moles of repeat units of structures (Ia) and (IIa). Further still, said diblock copolymer a-2) has a polydispersity from about 1.0 to about 1.1 and has an $M_n$ from about 30,000 g/mole to about 90,000 g/mole. In one aspect of this embodiment the moiety $R_{2a}$ is attached through a para linkage to the aromatic ring of the styrenic moiety. In a more specific aspect of these diblock copolymer embodiments $R_1$, $R_{1a}$, $R_2$ and $R_{2a}$ are H and $R_3$, $R_{3a}$, $R_4$, and $R_{4a}$ are individually selected from a C-1 to C-4 alkyl. In a more specific aspect of these embodiments $R_1$, $R_{1a}$, $R_2$ and $R_{2a}$ are H and $R_3$, $R_{3a}$, $R_4$, and $R_{4a}$ are methyl.

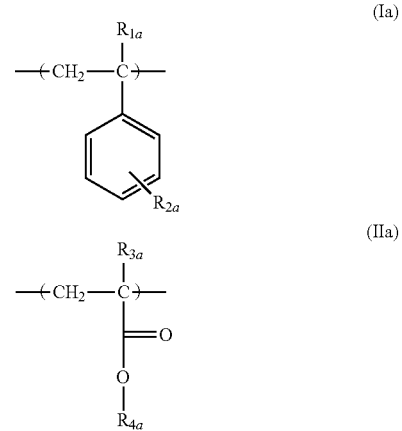

In another aspect of the above inventive composition, said diblock copolymer components a-1), and a-2) are ones wherein $R_1$, $R_{1a}$, $R_2$ and $R_{2a}$ are H and $R_3$, $R_{3a}$, $R_4$, and $R_{4a}$ are individually selected from a C-1 to C-4 alkyl. In a more specific aspect of this embodiment $R_1$, $R_{1a}$, $R_2$ and $R_{2a}$ are H and $R_3$, $R_{3a}$, $R_4$, and $R_{4a}$ are individually are methyl.

In any of the inventive composition, wherein component a) is said diblock copolymer components a-1), and a-2), it is one wherein a spacer moiety is present between the two block which is a moiety derived from a 1,1-diphenyl ethylene derivative. In this embodiment a-1) and a-2), respectively, have structure (I-S), and structure (I-S-a), wherein $R_{1s}$, $R_{1sa}$, $R_{2s}$, and $R_{2sa}$ are independently selected from hydrogen, a C-1 to C-8 alkyl, —$N(R_{3s})_2$, —$OR_{4s}$, and $Si(R_{5s})_3$, wherein $R_{3s}$, $R_{4s}$ and $R_{5s}$ are independently selected from a C-1 to C-4 alkyl. In another aspect of this embodiment $R_{1s}$, $R_{2s}$, $R_{1sa}$, and $R_{2sa}$ are hydrogen. In said structures (I-S) and (I-S-a), the polymer blocks Block A) and Block A-a) (a.k.a. styrenic blocks," these block chain are end attached to these spacer moieties through a secondary (a.k.a. when $R_1$ or $R_{1a}$=hydrogen) or tertiary (a.k.a. when $R_2$ or $R_{2a}$=C-1 to C-4 alkyl) position. Correspondingly, the polymer blocks Block B) and Block B-a) are end attached, respectively to the spacer moieties (I-S) and (I-S-a) to the "acrylic" repeat unit at the end of these block through a primary position (a.k.a. $CH_2$ moiety) on this "acrylic" repeat unit.

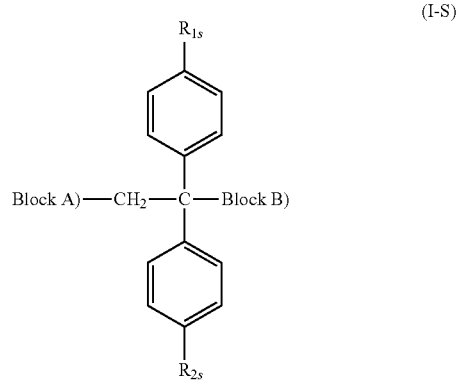

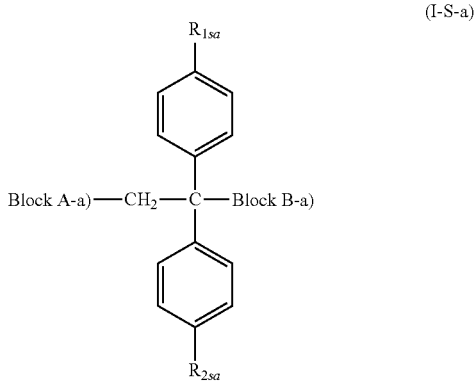

(I-S-a)

In any of the above aspects of the inventive composition, wherein component a) contains the diblock copolymer component a-1), this component has a polydispersity from about 1.00 to about 1.03. In another aspect of this embodiment component a-1), has an $M_n$ from about 93,000 g/mole to about 105,300 g/mole.

In other aspects of the inventive composition, in component a), the diblock copolymer component, a-1), the mole % of the repeat units of structure (I) is from about 60 mole % to about 80 mole % and for the repeat units of structure (II) from about 20 mole % to about 40 mole %.

In another aspect of the embodiment wherein component a) is a diblock copolymer comprising the repeat unit of structure (I) is from about 60 mole % to about 75 mole % and for the repeat units of structure (II) from about 25 mole % to about 40 mole %. In one aspects of the inventive composition, in component a), the diblock copolymer component, a-1), the mole % of structure (I) is from about 40 mole % to about 60 mole %, and the repeat units of structure (II) is from about 40 mole % to about 60 mole %.

In any of the above aspects of the inventive composition, it is one, wherein for component a) the diblock copolymer component a-2), has a polydispersity from about 1.00 to about 1.03.

In any of the above aspects of the inventive composition wherein component a) the diblock copolymer contains component a-2), this component has an $M_n$ from about 40,800 g/mole to about 61,200 g/mole.

In any of the above aspects of the inventive composition, it is one wherein for component a) the total mole % values, for the repeat units of structure (I) and (Ia) are from about 40 mole % to about 60 mole % and for the repeat units of structure (II) and (IIa) from about 40 mole % to about 60 mole % in for either a single block copolymer a-1) or a-2) or in a blend of a-1) and a-2).

In any of the above aspects of the inventive composition, it is one wherein for component a) the total mole % values, for the repeat units of structure (I) and (Ia) are from about 60 mole % to about 75 mole % and for the repeat units of structure (II) and (IIa) from about 25 mole % to about 40 mole % in for either a single block copolymer a-1) or a-2) or in a blend of a-1) and a-2).

In one aspect of the above described inventive composition, component a) may be a blend of a-1) and a-2).

In one aspect of the above described inventive composition, component a) is either a-1) or a-2).

In one aspect of the above described inventive composition, either when component a) is a diblock copolymer a-1), a diblock copolymer a-2) or a blend of a-1) and a-2), the total mole % values (based on total moles of all repeat units) of repeat units of structures (I) and (Ia) present in component a) is from about 45 mole % to about 75 mole %, and correspondingly, the sum of the mole % of repeat of structure (II) and (IIa) is from about 25 mole % to about 55 mole %.

In any of the above aspects of the inventive composition, the wt. % of component a) either when it comprises diblock copolymer(s) or a triblock copolymer(s) is from about 0.5 wt. % to about 2.00 wt. % of the total wt of the total composition.

Component b)

In any of the above aspects of the inventive compositions, which comprises the oligo diblock copolymer components b-2) and b-3), respectively, these may have a spacer moiety, respectively between block A-b) and block B-b) or between block A-c) and block B-c) as shown, respectively, in structure (I-S-b), and structure (I-S-c) wherein $R_{1sb}$, $R_{1s}$, $R_{2sb}$, and $R_{2sc}$ are independently selected from hydrogen, a C-1 to C-8 alkyl, $-N(R_{3s})_2$, $-OR_{4s}$, $Si(R_{5s})_3$, wherein $R_{3s}$, $R_{4s}$ and $R_{5s}$ are independently selected from a C-1 to C-4 alkyl. In another aspect this embodiment, $R_{1sb}$, $R_{2sb}$, $R_{1s}$, and $R_{2sc}$ are hydrogen.

In structures (I-S-b) and (I-S-c), the polymer blocks Block A-b) and Block A-c) (a.k.a. styrenic blocks," these block chain are end attached to these spacer moieties through a secondary (a.k.a. when $R_5$ or $R_7$=hydrogen), or tertiary (a.k.a. when $R_5$ or $R_7$=C-1 to C-4 alkyl) position. Correspondingly, the polymer blocks Block B-b) and Block B-c) are end attached, respectively to the spacer moieties (I-S-b) and (I-S-c) to the "acrylic" repeat unit at the end of these blocks through a primary position (a.k.a. $CH_2$ moiety) on this "acrylic," repeat unit.

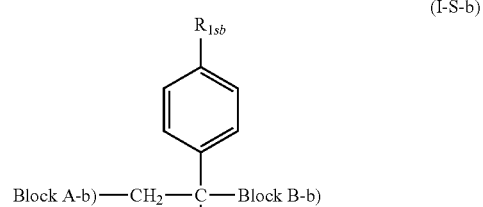

(I-S-b)

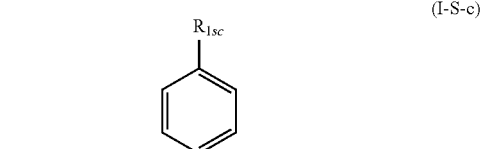

(I-S-c)

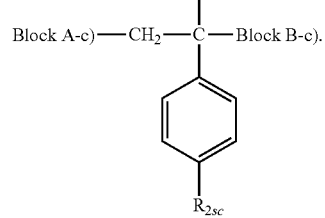

In any of the above aspects of the inventive composition, containing oligo random copolymer b-1), is one wherein $R_{1b}$, and $R_{2b}$ are H and $R_{3b}$, and $R_{4b}$, are methyl.

In any of the above aspects of the inventive composition, containing the oligo random copolymer b-1), has a polydispersity from about 1.3 to about 1.5

In any of the above aspects of the inventive composition, it is one wherein for component b), the oligo random copolymer b-1), has an $M_n$ from about 1000 g/mole to about 5000 g/mole.

In any of the above aspects of the inventive composition, it is one wherein for component b), the oligo random copolymer b-1), has a polydispersity from about 1.3 to about 1.6.

In any of the above aspects of the inventive composition, it is one, wherein component b), contains the oligo random copolymer b-1), and this component has a $T_g$ from about 50° C. to about 90° C.

In one aspect of the above described inventive composition component b) is oligo random copolymer b-1).

In the above aspects of the inventive composition, wherein component b), contains the oligo diblock copolymer b-2), wherein $R_5$, $R_7$ and $R_8$ are H, $R_6$ is n-octyl or n-nonyl, $R_9$ and $R_{11}$ are methyl, $R_{10}$ is methyl or ethyl, $R_{12}$ and $R_{13}$ are independently ethylene or propylene, and $R_{14}$ is methyl or ethyl. In another aspect of this embodiment the oligo diblock copolymer b-2) it is one in which $R_6$ is n-octyl, $R_{10}$ is methyl, $R_{12}$ and $R_{13}$ are ethylene, and $R_{14}$ is methyl.

In one aspect of the any of the above described inventive composition, wherein component b) contains oligo diblock copolymer b-2), it is one wherein the mole % of the sum of the mole % for repeat units (III) and (IV), based on the total moles of repeating units having structures (III), (IV), (V) and (VI), is from about 40 mole % to about 80 mole %, and the sum of the mole % for repeat unit (V) and (VI) ranges from about 20 mole % to about 60 mole %, and further wherein the mole % of repeat unit (III) ranges from about 2 mole % to about 80 mole % and the mole % of repeat unit (VI) ranges from about 1 mole % to about 80 mole %. In another aspect of this embodiment the mole % of repeat unit (III) is from about 2 mole % to about 64 mole %. In another aspect of this embodiment the mole % of (VI) ranges from about 2 mole % to about 48 mole %.

In all embodiments described herein for oligo diblock copolymer b-2) the individual values of the mole % for the repeat units of structures (III), (IV), (V), and (VI), are selected from their respective ranges to add up to 100 mole % of the total moles of repeat units of structures (III), (IV), (V), and (VI).

In other aspects of the inventive composition, the oligo diblock copolymer b-2), is one wherein, said mole % for the repeat units of structure (IV) is from about 25 mole % to about 50 mole %, and said mole % for the repeat units of structure (V) is from about 40 mole % to about 60 mole %.

In another aspects of the inventive composition, the oligo diblock copolymer b-2), is one wherein, for the repeat unit of structure (III) its mole % is from about 20% to about 30% of the mole % of the repeat unit of structure (IV), and for the repeat unit of structure (VI) its mole % is from about 12% to about 20% of the mole % of the repeat unit of structure (V).

In another aspect of the above described inventive composition, it is one wherein for the oligo diblock copolymer b-2) the mole % composition of Block A-b) and Block B-b is varied depending on the phase morphological window of the diblock copolymer component a), taken as a whole, either when component a) is a diblock copolymer a-1), a diblock copolymer a-2) or a blend of a-1) and a-2), as described above. Specifically, as an example, when the mole % of the sum of the repeat units of structure (III) and (IV) in Block A-b) is selected from about 40 mole % to about 80 mole %, the specific sum value selected in this range will match the total mole % values of repeat units of structures (I) and (Ia) present in component a) either when component a) is diblock copolymer a-1), a diblock copolymer a-2) or a blend of a-1) and a-2). Correspondingly, in Block B-b) when the sum of the mole % of repeat units of structures (V) and (VI) is from about 25 mole % to about 55 mole %, the specific sum value selected in this range will match the total mole % values of repeat of structure (II) and (IIa) present in component a) either when component a) is diblock copolymer a-1), a diblock copolymer a-2) or a blend of a-1) and a-2).

In the above aspects of the inventive composition, wherein component b), contains the oligo diblock copolymer b-2), it has a polydispersity from about 1.03 to about 1.08.

In the above aspects of the inventive composition, wherein for component b), contains the oligo diblock copolymer b-2), it has an $M_n$ from about 15000 g/mole to about 32000 g/mole e.g. from about 15000 g/mole to about 30000 g/mole.

In the above aspects of the inventive composition, wherein component b), contains the oligo diblock copolymer b-2), it has a $T_g$ from about 50° C. to about 90° C.

In one aspect of the above described inventive composition, component b) is oligo diblock copolymer b-2).

The composition of any one of the inventive composition, wherein, component b), the oligo diblock copolymer b-3), is one wherein $R_{1c}$, and $R_{2c}$ are H and $R_{3c}$, and $R_{4c}$, are individually selected from a C-1 to C-4 alkyl. In another aspect of this embodiment rein $R_{1c}$, and $R_{2c}$ are H and $R_{3c}$, and $R_{4c}$, are methyl.

In the above aspects of the inventive composition, wherein component b), contains the oligo diblock copolymer b-3) and it has an $M_n$ from about 15,000 to about 30,000 g/mole.

In the above aspects of the inventive composition, wherein component b), contains the oligo diblock copolymer b-3) and it has a polydispersity of about 1.02 to about 1.08.

In the above aspects of the inventive composition, wherein component b), contains the oligo diblock copolymer b-3) it is one wherein, said mole % for the repeat units of structure (Ic) is from about 40 mole % to about 70 mole %, and said mole % for the repeat units of structure (IIc) is from about 40 mole % to about 70 mole %.

In the above aspects of the inventive composition, wherein component b), contains the oligo diblock copolymer b-3), it has a $T_g$ from about 50° C. to about 90° C.

In one embodiment of the above inventive composition, component b) is diblock copolymer b-3).

In one embodiment of the above describe inventive composition which may be suitable for L/S application a) the diblock copolymer component a-1), the mole % values, for the repeat units of structure (I) are from about 40 mole % to about 60 mole % and for the repeat units of structure (II) from about 40 mole % to about 60 mole %.

In one embodiment of the above describe inventive composition which may be suitable for CH application a) the diblock copolymer component a-1), the mole % values, for the repeat units of structure (I) are from about 60 mole % to about 75 mole % and for the repeat units of structure (II) from about 25 mole % to about 40 mole %.

In any of the above described embodiment of component b), this component may be from about 0.05 wt. % to about 0.5 wt. % of the total weight of the composition including the spin casting organic solvent. In another aspect of this embodiment it is from about 0.08 wt. % to about 0.4 wt. %. In another aspect of this embodiment it is from about 1 wt. % to about 0.4 wt. %. In another aspect of this embodiment it is from about 0.15 wt. % to about 0.4 wt. %. In yet another aspect of this embodiment it is from about 0.2 wt. % to about 0.3 wt. %. In still another aspect of this embodiment, component b) is b-1). In another aspect of this embodiment component b) is b-2). In still another embodiment component b) is b-3). In still another aspect of this embodiment component b) is a mixture of at least two component b) components selected from the group consisting of b-1), b-2) and b-3).

Component c)

For component c), the spin casting organic solvent, suitable solvent for dissolving the above described inventive compositions include. a glycol ether derivative such as ethyl cellosolve, methyl cellosolve, propylene glycol monomethyl ether (PGME), diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate (PGMEA); carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate (EL), ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; a ketal or acetal like 1,3 dioxalane and diethoxypropane; lactones such as butyrolactone; an amide derivative such as dimethylacetamide or dimethylformamide, anisole, and mixtures thereof.

Additionally, the above described inventive composition may further comprise additives selected from the group consisting of: surfactants, inorganic-containing polymers; additives including small molecules, inorganic-containing molecules, surfactants, photoacid generators, thermal acid generators, quenchers, hardeners, cross-linkers, chain extenders, and the like; and combinations comprising at least one of the foregoing, wherein one or more of the additional components and/or additives co-assemble with the block copolymer to form the block copolymer assembly.

Inventive Processes

The inventive compositions described herein may be used in an unguided self-assembly process to produce arrays of features or in directed (a.k.a. guided) self-assembly processes such as graphoepitaxy or chemoepitaxy to affect either pattern rectification or pattern multiplication of the chemoepitaxy or graphoepitaxy guiding features.

After self-assembly these patterns may be transferred into the underlying substrate by using a plasma. In general, anisotropic etching with an oxygen containing plasma as used to etch resists (e.g. J. B. Kruger, et al, "VLSI Electronics, Microstructure Science," Chapter 5, Academic Press, p. 91-136, 1984) are most commonly used in etching semiconductor substrates using self-assembled films of a block copolymer of methyl-methacrylate and polystyrene a mask (e.g. "Etch considerations for directed self-assembly patterning using capacitively coupled plasma," Vinayak Rastogi et al, Journal of Vacuum Science & Technology A 36, 031301, 2018), Since the novel compositions described herein contain such block copolymers these generally type of conditions may be used to affect pattern transfer into the substrate of self-assembled films of the inventive composition.

One aspect of this invention is a process comprising steps:
i) forming a coating of a neutral layer on a substrate,
ii) coating the composition of any of the above described inventive compositions, onto said neutral layer, to form a film
ii) baking said film, in an inert gas atmosphere, at a temperature selected from about 240° C. to about 260° C., to form a self-assembled film, and
iii) etching said substrate with a plasma to pattern transfer said self-assembled film into the substrate.

Another aspect of this invention is a process for forming a line and space array comprising steps:
ia) forming a coating of a neutral layer on a substrate,
iia) coating the inventive composition described above as suitable for L/S application, onto said neutral layer, to form a film
iiia) baking said film, in an inert gas atmosphere, at a temperature selected from about 240° C. to about 260° C., to form a self-assembled film, and
iva) etching said substrate with a plasma to pattern transfer said self-assembled film into the substrate forming a L/S array.

Another aspect of this invention is a process for forming a line and space L/S pattern through a graphoepitaxy process comprising steps:
ia') forming a coating of a neutral layer on a substrate,
iia') coating a photoresist on top of the coating of the neutral layer to form a photoresist film,
iiia') patterning the photoresist to produce a L/S patterned photoresist,
iva') coating the inventive composition described above as suitable for L/S application over said patterned photoresist, producing a film in which the L/S pattern is filled with said inventive composition suitable for L/S, and is flush with the surface of the photoresist
va') baking said film, in an inert gas atmosphere, at a temperature selected from about 240° C. to about 260° C., to form a self-assembled film, and
via') etching said substrate with a plasma to pattern transfer said self-assembled film into the substrate forming a L/S pattern.

Another aspect of this invention is a process a line and space (L/S) pattern through an chemoepitaxy process comprising steps:
ia") forming a coating of a neutral layer on a substrate,
iia") coating a photoresist on top of the coating of the neutral layer to form a photoresist film,
iiia") patterning the photoresist to produce a L/S patterned photoresist film,
iva") etching the underlying neutral layer using the patterned photoresist film, as a mask,
va") stripping the resist forming a patterned neutral layer which is a chemoepitaxy pattern with no significant topography, via") coating the inventive composition, described above as suitable for L/S application, over said patterned neutral layer, to form a block copolymer film, viia") baking said block copolymer film, in an inert gas atmosphere, at a temperature selected from about 240° C. to about 260° C., to form a self-assembled film, and viiia") etching said substrate with a plasma to pattern transfer said self-assembled film into the substrate forming a L/S pattern.

Another aspect of this invention is a process for forming a contact hole (CH) array comprising steps:

ib) forming a coating of a neutral layer on a substrate, iib) coating the composition described above as suitable for CH application onto said neutral layer, to form a film, iiib) baking said film, in an inert gas atmosphere, at a temperature selected from about 240° C. to about 260° C., to form a self-assembled film, and ivb) etching said substrate with a plasma to pattern transfer said self-assembled film into the substrate forming a CH array.

Another aspect of this invention is a process for forming contact holes (CH) pattern through a graphoepitaxy process comprising steps:

ib') forming a coating of a neutral layer on a substrate, iib') coating a photoresist on top of the coating of the neutral layer to form a photoresist film, iiib') patterning the photoresist to produce a CH patterned photoresist, ivb') coating the inventive composition described above as suitable for CH application over said patterned photoresist, producing a film in which the L/S pattern is filled with said inventive composition suitable for L/S, and is flush with the surface of the photoresist vib') baking said film, in an inert gas atmosphere, at a temperature selected from about 240° C. to about 260° C., to form a self-assembled film, and viib') etching said substrate with a plasma to pattern transfer said self-assembled film into the substrate forming a CH pattern.

Another aspect of this invention is a process for forming a line and space through an chemoepitaxy process comprising steps:

ib") forming a coating of a neutral layer on a substrate, iib") coating a photoresist on top of the coating of the neutral layer to form a photoresist film, iiib") patterning the photoresist to produce a CH patterned photoresist, ivb") etching the underlying neutral layer using the patterned photoresist, as a mask, vb") stripping the resist forming a patterned neutral layer which is a chemoepitaxy pattern with no significant topography, vib") coating the inventive composition, described above as suitable for CH application, over said patterned neutral layer, to form a block copolymer film, viib") baking said block copolymer film, in an inert gas atmosphere, at a temperature selected from about 240° C. to about 260° C., to form a self-assembled film, and viiib') etching said substrate with a plasma to pattern transfer said self-assembled film into the substrate forming a CH pattern.

In the above described inventive processes when the inventive composition is coated on a substrate to form a coating, optionally it may be heated in an additional step, prior to the heating step to produce the self-assembled film, in order to remove the spin casting organic solvent in a distinct separate step. For this additional step the film may can be heated at temperatures ranging from about 100° C. to about 150° C., or from about 120° C. to about 150° C.

Typical film thickness ranges from about 25 nm to about 70 nm after heating, or about 40 nm to about 60 nm, or about 45 nm to about 55 nm, or about 45 nm to about 52 nm.

It is also anticipated that the novel compositions described above as suitable for CH or L/S could be used in other chemoepitaxy and graphoepitaxy processes or in hybrid process combining these two. For instance, in chemoepitaxy, the guiding pinning features could instead be a patterned discrete organic pinning layer instead of just being an area of uncovered bare semiconductor substrate. For example, this patterned pinning layer could overly a neutral layer, or be beneath a patterned pinning layer.

Inventive compositions that may be used for the formation of contact hole array are ones comprising a component a) which is a diblock copolymer component selected from the group consisting of diblock copolymer a-1), diblock copolymer a-2) and a blend of a-1) and a-2), whose total mole % of styrenic repeat units of structures (I) and (Ia) is from about 60 mole % to about 75 mole % and whose total mole % of acrylic repeat units of structure (II) and (IIa) is from about 40 mole % to about 60 mole % and where component b) may be chosen from copolymer b-1), copolymer b-2), such as oligo diblock copolymer b-2) or copolymer b-3) and a mixture of these. In one aspect of this embodiment component b) is only oligo random copolymer b-1), in another it is only copolymer b-2) and in yet another it is only copolymer b-3).

Inventive compositions that may be use for the formation of Line and space (L/S) arrays are ones wherein component a) is a diblock copolymer component selected from the group consisting of diblock copolymer a-1), diblock copolymer a-2) and a blend of a-1) and a-2), whose total mole % of styrenic repeat units of structure (I) and (Ia) is from about 60 mole % to about 75 mole % and further wherein the total mole % of the acrylic repeat units of structures (II) and (IIa) is from about 25 mole % to about 40 mole % and component b) is copolymer b-1), such as oligo random copolymer b-1), copolymer b-2), such as oligo diblock copolymer b-2), or copolymer b-3), such as oligo diblock copolymer b-3). In aspect of this embodiment component b) is only oligo random copolymer b-1), in another it is only copolymer b-2) and in yet another it is only copolymer b-3).

Inventive compositions that may be use for the formation of Line and space (L/S) arrays are ones wherein component a) is selected from the group consisting of triblock copolymer component a-1t), triblock copolymer a-2t) and a blend of a-1t) and a-2t) whose total mole % of styrenic repeat units of structures (I) and (Ia) is from about 60 mole % to about 75 mole % and whose total mole % of acrylic repeat units of structure (II) and (IIa) is from about 40 mole % to about 60 mole %, and component b) is copolymer b-2 or copolymer b-3), such as oligo diblock copolymer b-3). In one aspect of this embodiment component b) is only copolymer b-2) and in yet another it is only copolymer b-3).

Inventive compositions that may be use for the formation of a contact hole arrays are ones wherein component a) is selected from the group consisting of triblock copolymer component a-1t), triblock copolymer a-2t) and a blend of a-1t) and a-2t) whose total mole % of styrenic repeat units of structure (I) and (Ia) is from about 60 mole % to about 75 mole % and further wherein the total mole % of the acrylic repeat units of structures (II) and (IIa) is from about 25 mole % to about 40 mole % and component b) is copolymer b-2), such as oligo diblock copolymer b-2), or copolymer b-3), such as oligo diblock copolymer b-3). In aspect of this embodiment component b) is only copolymer b-2) and in yet another it is only copolymer b-3).

Another aspect of this invention is a process for forming a contact hole array comprising steps:
  i) forming a coating of a neutral layer on a substrate,
  ii) coating a composition comprising a diblock copolymer described above as suitable for forming a contact hole array onto said neutral layer, to form a film,
  ii) baking said film, in an inert gas atmosphere, at a temperature selected from about 240° C. to about 260° C., to form a self-assembled film, and
  iii) etching said substrate with a plasma to pattern transfer said self-assembled film into the substrate.

In one aspect of this embodiment the b) component is a oligo random copolymer b-1), in another aspect component b) is copolymer b-2), and in yet another component b) is copolymer b-3).

Another aspect of this invention is a process for forming a L/S array comprising steps:
  ib) forming a coating of a neutral layer on a substrate,
  iiib) coating the composition comprising a diblock copolymer described above as suitable for forming a L/S array onto said neutral layer, to form a film
  ivb) baking said film, in an inert gas atmosphere, at a temperature selected from about 240° C. to about 260° C., to form a self-assembled film, and
  vb) etching said substrate with a plasma to pattern transfer said self-assembled film into the substrate.

In one aspect of this embodiment the b) component is a oligo random copolymer b-1), in another aspect component b) is copolymer b-2), and in yet another component b) is copolymer b-3).

A process for forming a line and space array comprising steps:
  ic) forming a coating of a neutral layer on a substrate,
  iiic) coating a composition comprising a triblock copolymer described above as suitable for forming a L/S array onto said neutral layer, to form a film
  ivc) baking said film, in an inert gas atmosphere, at a temperature selected from about 240° C. to about 260° C., to form a self-assembled film, and
  vc) etching said substrate with a plasma to pattern transfer said self-assembled film into the substrate.

A process for forming a contract hole array comprising steps:
  id) forming a coating of a neutral layer on a substrate,
  iiid) coating a composition comprising a triblock copolymer described above as suitable for forming a contact hole array onto said neutral layer, to form a film
  ivd) baking said film, in an inert gas atmosphere, at a temperature selected from about 240° C. to about 260° C., to form a self-assembled film, and
  vd) etching said substrate with a plasma to pattern transfer said self-assembled film into the substrate.

Inventive Oligo Diblock Copolymer

Another aspect of this invention is an inventive oligo diblock copolymer comprising block A-b) and block B-b) having an $M_n$ from about 1,000 to 35,000 g/mole, and a polydispersity from 1.0 to about 1.1. In this inventive material block A-b) is a random copolymer of repeat units having structures (III), and (IV), and block B-b) is a random copolymer of repeat units having structures (V), and (VI). Further, in this novel oligo diblock copolymer $R_5$, $R_7$, $R_9$, and $R_{11}$, are independently selected from H or a C-1 to C-4 alkyl, $R_6$ is a C-7 to C-10 linear alkyl, $R_8$ is a C-1 to C-4 alkyl, $R_{10}$ is a C-1 to C-4 alkyl, $R_{12}$ and $R_{13}$ are individually selected from a C-2 to C-5 alkylene, and $R_{14}$ is a C-1 to C-4 alkyl, $R_5$, $R_7$, $R_9$, and $R_{11}$, are independently selected from H or a C-1 to C-4 alkyl, $R_6$ is a C-7 to C-10 linear alkyl, $R_8$ is a C-1 to C-4 alkyl, $R_{10}$ is a C-1 to C-4 alkyl, $R_{12}$ and $R_{13}$ are individually selected from a C-2 to C-5 alkylene, and $R_{14}$ is a C-1 to C-4 alkyl, and further, said inventive oligo diblock copolymer has a $T_g$ which has a value from about 0° C. to about 95° C.

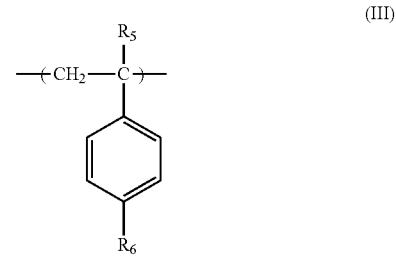

(III)

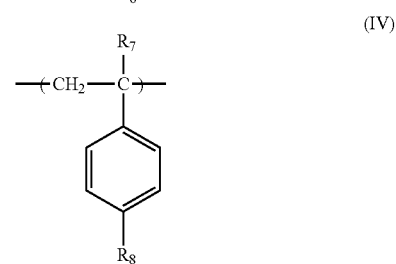

(IV)

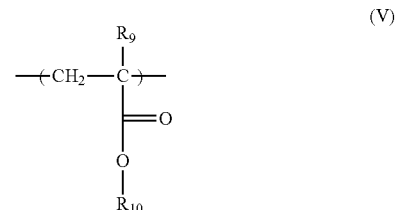

(V)

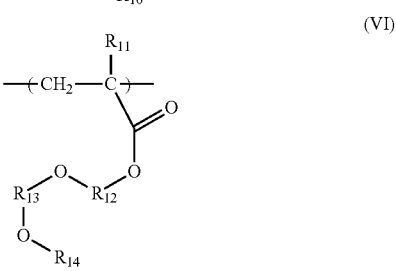

(VI)

In one aspect of this inventive oligo diblock copolymer the mole % values, based on the total moles of repeat units of structures (III), (IV), (V), and (VI), are as follow:
  for the repeat units of structure (IV) its mole % is from about 10 mole % to about 50 mole %,
  for the repeat units of structure (V) its mole % from about 20 mole % to about 60 mole %,
  for the repeat unit of structure (III) its mole % is from about 10% to about 0% of the mole % of the repeat unit of structure (IV),
  for the repeat unit of structure (VI) its mole % is from about 10% to about 40% of the mole % of the repeat unit of structure (V), and the individual values of the mole % for the repeat units of structures (III), (IV), (V), and (VI), are selected from their respective ranges to add up to 100 mole % of the total moles of repeat units of structures (III), (IV), (V), and (VI).

In another aspect of the above described inventive oligo diblock copolymer it is which has a spacer moiety, between block A-b) and block B-b) as shown in structure (I-S-b), wherein $R_{1sb}$ and $R_{2sb}$ are independently selected from hydrogen, a C-1 to C-8 alkyl, $-N(R_{3s})_2$, $-OR_{4s}$, $Si(R_{5s})_3$, wherein $R_{3s}$, $R_{4s}$ and $R_{5s}$ are independently selected from a C-1 to C-4 alkyl. In another aspect of this embodiment, $R_{1sb}$ and $R_{2sb}$, are hydrogen.

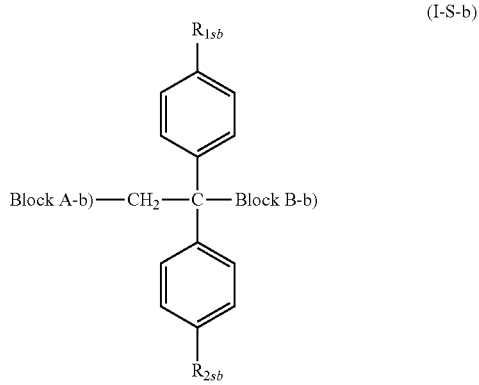

(I-S-b)

In another aspect of the above described inventive oligo diblock copolymer it is one wherein $R_5$, $R_7$ and $R_8$ are H, $R_6$ is a C-8 to C-9 linear alkyl, $R_9$ and $R_1$ are methyl, $R_{10}$ is methyl or ethyl, $R_{12}$ and $R_{13}$ are independently ethylene or propylene, and $R_{14}$ is methyl or ethyl. In another aspect of this embodiment $R_6$ is n-octyl, $R_{10}$ is methyl, $R_{12}$ and $R_{13}$ are ethylene, and $R_{14}$ is methyl.

In another aspect of the above described inventive oligo diblock copolymer it has a $M_n$ from about 15,000 to about 25,000 g/mole.

In another aspect of the above described inventive oligo diblock copolymer it is one wherein said mole % for the repeat units of structure (IV) is from about 25 mole % to about 50 mole %, and said mole % for the repeat units of structure (V) is from about 40 mole % to about 60 mole %.

In another aspect of the above described inventive oligo diblock copolymer it is one wherein the mole % of the sum of the mole % for repeat units (III) and (IV), based on the total moles of repeating units having structures (III), (IV), (V) and (VI), is from about 40 mole % to about 80 mole % and the sum of the mole % for repeat unit (V) and (VI) ranges from about 20 mole % to about 60 mole %, and further wherein the mole % of repeat unit (III) ranges from about 2 mole % to about 80 mole % and the mole % of repeat unit (VI) ranges from about 1 mole % to about 80 mole %, and further wherein the individual values of the mole % for the repeat units of structures (III), (IV), (V), and (VI), are selected from their respective ranges to add up to 100 mole % of the total moles of repeat units of structures (III), (IV), (V), and (VI).

In another aspect of the above described inventive oligo diblock copolymer it is one wherein the mole % of repeat unit (III) is from about 2 mole % to about 64 mole %.

In another aspect of the above described inventive oligo diblock copolymer it is one wherein the mole % of (VI) ranges from about 2 mole % to about 48 mole %.

In another aspect of the above described inventive oligo diblock copolymer it is one wherein for the mole % for the repeat unit of structure (III) is from about 20% to about 30% of the mole % of the repeat unit of structure (IV), and for the repeat unit of structure (VI) its mole % is from about 12% to about 20% of the mole % of the repeat unit of structure (V).

In all embodiments described herein for this novel oligo diblock copolymer, the individual values of the mole % for the repeat units of structures (III), (IV), (V), and (VI), are selected from their respective described ranges herein to add up to 100 mole % of the total moles of repeat units of structures (III), (IV), (V), and (VI).

In another aspect of the above described inventive oligo diblock copolymer it is one wherein said oligo diblock copolymer has a polydispersity from about 1.03 to about 1.08.

In another aspect of the above described inventive oligo diblock copolymer it is wherein said oligo diblock copolymer has an $M_n$ from about 15,000 g/mole to about 32,000 g/mole.

In another aspect of the above described inventive oligo diblock copolymer it is one wherein said oligo diblock copolymer has a $T_g$ from about 50° C. to about 90° C.

A further aspect of this invention is the use of the composition according to the invention or the oligo diblock copolymer according to the invention for preparing a self-assembled film on a substrate.

EXAMPLES

Chemicals

All chemicals unless otherwise indicated were purchased from Sigma Aldrich (3050 Spruce St., St. Louis, MO 63103). Chemicals used in anionic polymerization were purified as described in the literature (e.g. Techniques in High-Vacuum Anionic Polymerization" By David Uhrig and Jimmy Mays and Journal of Polymer Science: Part A: Polymer Chemistry, Vol. 43, 6179-6222 (2005))

All synthetic experiments were carried out under $N_2$ atmosphere. Lithographic experiments were carried out as described in the text. The molecular weight of the copolymers was measured with a Gel Permeation Chromatograph. Gel permeation chromatography equipped with 100 Å, 500 Å, $10^3$ Å, $10^5$ Å and $10^6$ Å μ-ultrastyragel columns Lithographic Experiments were done using a TEL Clean ACT8 track. SEM pictures were taken with an applied Materials NanoSEM_3D Scanning electron microscope picture are shown at either 1 FOV magnification or 2 FOV magnification (Field of view (FOV)=5 μm or).

Etching experiments were done using standard isotropic oxygen etching conditions for self-assembled films block copolymer of methyl methacrylate and styrene.

Unless otherwise indicated Molecular weight measurements (a.k.a. $M_n$ polydispersity) were done by Gel permeation chromatography (PSS Inc. Germaby) equipped with 100 Å, 500 Å, $10^3$ Å, $10^5$ Å and $10^6$ Å μ-ultrastyragel columns using THF solvent as an eluent. Polystyrene polymer standards were used for calibration.

DSC measurement of glass transition temperature were done using a TA instrument DSC Q1000 under nitrogen with a heating rate of 10° C./min. The glass transition temperature ($T_g$) was measured in first heating scan from 0 to 300° C. The midpoint of endothermic transition was considered

[1] H NMR spectra were recorded using Bruker Advanced III 400 MHz spectrometer.

Synthesis Example 1: Synthesis of PS-co-PMMA Neutral Layer Material 250-ml flask equipped with a temperature controller, heating mantle and magnetic stirrer were set up. 26.04 grams (0.25 moles) of styrene, 24.03 grams (0.24 moles) of methyl methacrylate, 1.42 grams (0.10 moles) of glycidyl methacrylate, 0.41 grams (0.0025 moles) of Azobisisobutyronitrile (AIBN) initiator and 100 grams of anisole were added to the flask. The stirrer was turned on and set up at about 400 rpm. The reaction solution was then degassed by vigorously bubbling nitrogen through the solution for about 30 minutes at room temperature. After 30 minutes of degassing the heating mantle was turned on and the temperature controller was set at 70° C., and the stirred reaction mixture was maintained at this temperature for 20 hours. After this time the heating mantle was turned off and the reaction solution was allowed to cool down to about 40° C. Then the reaction mixture was poured into 1.5 L of isopropanol stirred with a mechanical stirring during the addition. During this addition, the polymer was precipitated out. The precipitated polymer was collected by filtration. The collected polymer was dried in vacuum oven at 40° C. About 36 grams of the polymer was obtained. This dried polymer was dissolved in 300 grams of THF and then filtered through a 0.2 um nylon filter. The filtered solution was then precipitated again into a stirred solution of 1.5 L methanol, the precipitated polymer collected and dried as before under vacuum at 40° C. In this manner, 26 grams (50% yields) of the polymer was obtained after dry. The polymer had an $M_w$ of about 36k and a polydispersity (PDI) of 1.5.

Synthesis Example 2: Synthesis of P(S-b-MMA) (78K-b-39K)

Styrene and methyl methacrylate monomers were distilled in the presence of dehydrating agents into calibrated ampules and stored under $N_2$. Liquids were transferred into the reactor either via ampule or using stainless steel cannula under $N_2$. Into a dry 1 L round bottom reactor equipped with side arms for connecting ampules, magnetic stir bar, nitrogen/vacuum three-way septum adapter, was added 700 mL dry tetrahydrofuran. The temperature of the reactor was reduced to −78° C. using dry ice-acetone bath. Then, after titrating the impurities, 0.2 mL (1.4 M solution) of sec-butyllithium was added into the reactor. Then 20 g (0.192 moles) of styrene was added from ampule into the reactor under fast stirring. The reaction solution turned into yellow-orange and the reaction was stirred over 30 minutes. Subsequently, 0.06 g (0.0003 moles) of 1,1'-diphenylethylene (DPE) in 2.5 ml of dry toluene was added via ampule into the reactor. The orange color of the reaction mixture turned into dark brick-red indicating conversion of styryllithium active centers to delocalized DPE adduct carbanion. After 2 min of stirring, a small amount (2 mL) of the reaction mixture was withdrawn for PS block molecular weight analysis. Then methyl methacrylate (9.98 g, 0.0998 moles) was added via ampule. The reaction was terminated after 30 min with 1 mL of degassed methanol. The block copolymer was recovered by precipitation in excess isopropanol (5 times of the polymer solution) containing 10% water, filtered, and dried at 55° C. for 12 h under vacuum giving 28 g of P(S-b-MMA) (94% yield) consisting of 66 mol. % of polystyrene block and 34 mol. % of polymethylmethacrylate block. Gel permeation chromatography equipped with 100 Å, 500 Å, $10^3$ Å, $10^5$ Å and $10^6$ Å µ-ultrastyragel columns showed that the $1^{st}$ P(SDPE) block had $M_n$ (GPC)=64,622 g/mol and $M_w/M_n$=1.02 with respect to PS calibration standards. The diblock copolymer molecular weight obtained from GPC is $M_{n,PS-b-PMMA}$=107,150 g/mol and $M_w/M_n$=1.01.

Synthesis Example 3: Synthesis of P(S-b-MMA) (34K-17K)

PS-PMMA (34-17K) was synthesized using the same procedure described in example 2. To achieve the target $M_n$ of PS block and PMMA block, 0.42 mL of 1.4 M solution of sec-butyllithium was added while keeping the quantity of styrene and MMA same as example 2. Gel permeation chromatography equipped with 100 Å, 500 Å, $10^3$ Å, $10^5$ Å and $10^6$ Å µ-ultrastyragel columns showed that the $1^{st}$ P(SDPE) block had $M_n$ (GPC)=34,872 g/mol and $M_w/M_n$=1.03 with respect to PS calibration standards. The diblock copolymer molecular weight obtained from GPC is $M_{n,PS-b-PMMA}$=49,240 g/mol and $M_w/M_n$=1.02. H NMR showed 66.1 mol. % of polystyrene block and 33.9 mol. % of polymethylmethacrylate block.

Synthesis Example 4 Synthesis of P(S-b-MMA) (45k-b-51k)

P(S-b-MMA) (45K-b-51K) was synthesized using the same procedure as described in example 2. To achieve target $M_n$ and compositions of PS and PMMA block, the amount of initiator and monomer quantities were changed. Briefly, 20 g (0.192 moles) of styrene was polymerized with 0.32 mL (1.4M solution) of sec-butyllithium. Then 0.095 g (0.0005 moles) of 1,1'-diphenylethylene (DPE) in 2.5 ml of dry toluene was added via ampule into the reactor. The orange color of the reaction mixture turned into dark brick-red indicating conversion of styryllithium active centers to delocalized DPE adduct carbanion. After 2 min of stirring, a small amount (2 mL) of the reaction mixture was withdrawn for PS block molecular weight analysis. Then methyl methacrylate (22.85 g, 0.23 moles) was added via ampule. The reaction was terminated after 30 min with 1 mL of degassed methanol. The block copolymer was recovered by precipitation in excess isopropanol (5 times of the polymer solution) containing 10% water, filtered, and dried at 55° C. for 12 h under vacuum giving 40 g of P(S-b-MMA) (94% yield) consisting of 46.9 mol. % of polystyrene block and 53.1 mol. % of polymethylmethacrylate block. Gel permeation chromatography equipped with 100 Å, 500 Å, $10^3$ Å, $10^5$ Å and $10^6$ Å µ-ultrastyragel columns showed that the $1^{st}$ P(SDPE) block had $M_n$ (GPC)=45,048 g/mol and $M_w/M_n$=1.04 with respect to PS calibration standards. The diblock copolymer molecular weight obtained from GPC is $M_{n,PS-b-PMMA}$=88,348 g/mol and $M_w/M_n$=1.02.

Synthesis Example 4a Synthesis of Triblock Polymer MMA-S-MMA, 50k-88k-50k

The triblock polymer MMA-S-MMA was prepared in THF solution, using procedures as described in the literature (Makmrnol. Chem. 191, 2309-2318 (1990) and Adv. Polym. Sci. 86, 147 (1988) using naphthalene potassium as the initiator. In order to avoid the attack of the ester group of MMA by the PS carbanions, 1,1-diphenylethylene (DPE) was introduced to decrease the nucleophilicity of the active sites. The presence of a single DPE unit in the copolymer between two blocks does not affect its properties, whatsoever. In order to perform the polymerization of MMA under good conditions at low temperature (−70° C.). The polymer prepared in this fashion had a $M_w$ of PMMA (50K)-PS (88K)-PMMA(50K) with a polydispersity of 1.04 as measured by Gel permeation chromatography GPC.

Synthesis Example 5: Synthesis of Oligomer of Statistical Copolymers Consisting of Styrene and Methyl Methacrylate (P(S-co-MMA)) for Contact Hole Assembly Additive Reaction was conducted in a 250 ml flask equipped with a condenser, nitrogen inlet, and magnetic stir-bar under nitrogen. The flask was charged with 18.23 grams (0.17 moles) of styrene, 7.5 grams (0.075 moles) of methyl methacrylate, 2 grams (0.012 moles, 5% with respect to total monomers) of Azobisisobutyronitrile (AIBN) initiator, 0.7 grams (0.0075 moles) of 1-butane thiol, and 50 grams of anisole. The reaction solution was then degassed 3 times by vacuum/nitrogen cycles using freeze-thaw method and finally filled with nitrogen. Then, the reaction was kept in oil batch at 85° C. for 15 h under stirring. After this time, the reaction solution was allowed to cool down to about 25° C. Then the reaction mixture diluted with 100 mL of tetrahydrofuran and poured slowly into 700 mL of isopropanol stirred with a mechanical stirring during the addition. The precipitated polymer was collected by filtration. The collected polymer was dried in vacuum oven at 40° C. The yield was 45% and the copolymer had $M_{n,GPC}$=4,700 g/mol, $M_{w,GPC}$=6,500 g/mol and a polydispersity index (PDI) of 1.38 against polystyrene calibration standards. The copolymer $T_g$=86° C. and $^1$H NMR confirmed that the copolymer had 63 mol. % and 37 mol. % of polystyrene and polymethylmethacrylate, respectively.

Synthesis Example 6: Synthesis of Oligomer of Statistical Copolymers Consisting of Styrene and Methyl Methacrylate (P(S-co-MMA)) for Line and Space Assembly Additive Reaction was conducted in a 250 ml flask equipped with a condenser, nitrogen inlet, and magnetic stir-bar under nitrogen. The flask was charged with 13 grams (0.12 moles) of styrene, 13.7 grams (0.14 moles) of methyl methacrylate, 2 grams (0.012 moles, 5% with respect to total monomers) of Azobisisobutyronitrile (AIBN) initiator, 0.7 grams (0.0075 moles) of 1-butane thiol, and 50 grams of anisole. The reaction solution was then degassed 3 times by vacuum/nitrogen cycles using freeze-thaw method and finally filled with nitrogen. Then, the reaction was kept in oil batch at 85° C. for 15 h under stirring. After this time, the reaction solution was allowed to cool down to about 25° C. Then the reaction mixture diluted with 100 mL of tetrahydrofuran and poured slowly into 700 mL of isopropanol stirred with a mechanical stirring during the addition. The precipitated polymer was collected by filtration. The collected polymer was dried in vacuum oven at 40° C. The yield was 45% and the copolymer had $M_{n,GPC}$=2,300 g/mol, $M_{w,\ GPC}$=4,300 g/mol and a polydispersity index (PDI) of 1.82 against polystyrene calibration standards. The copolymer $T_g$=53° C. and $^1$H NMR confirmed that the copolymer had 42 mol. % and 58 mol. % of polystyrene and polymethylmethacrylate, respectively.

Comparative Synthesis Example 1: Synthesis of High Molecular Weight Statistical Copolymer Consisting of Styrene and Methyl Methacrylate (P(S-co-MMA)) for Line and Space Assembly Additive Following the similar procedure as described in Synthesis Example 5, a higher molecular weight with $M_n$ 11,529, $M_w$, 19,600 K (PDI-1.7) was also made in the absence of 1-butane thiol of comparison purpose, which had 45 mol. % and 55 mol. % of polystyrene and polymethylmethacrylate, respectively in the copolymer and exhibited $T_g$ of 108° C.

Synthesis Example 7: Synthesis of Oligo Block Copolymer Consisting of Styrene and Methyl Methacrylate for L/S Assembly Additive Required monomers were distilled in the presence of dehydrating agents into calibrated ampules and stored under $N_2$. Liquids were transferred into the reactor either via ampule or using stainless steel cannula under $N_2$. Into a dry 1 L round bottom reactor equipped with side arms for connecting ampules, magnetic stir bar, nitrogen/vacuum three-way septum adapter, was added 400 mL dry tetrahydrofuran. The temperature of the reactor was reduced to −78° C. using dry ice-acetone bath. Then, after titrating the impurities, 1.4 mL (0.00189 moles) of sec-butyllithium was added into the reactor. Subsequently, styrene (18.8 g) was added from ampule into the reactor under fast stirring. The reaction solution turned into orange and the reaction was stirred over 10 min. Subsequently, 0.4 g of 1,1'-diphenylethylene (DPE) in 3 ml of dry toluene was added via ampule into the reactor. The orange color of the reaction mixture turned into dark brick-red indicating conversion of styryl-lithium active centers to delocalized DPE adduct carbanion. After 2 min of stirring, a small amount (2 mL) of the reaction mixture was withdrawn for PS block molecular weight analysis. Then, 19.4 grams of methyl methacrylate (MMA), distilled over a small amount of triethylaluminum (1M in toluene), was added via ampule. The reaction was terminated after 15 min with 1 mL of degassed methanol. The block copolymer was recovered by precipitation in excess methanol (5 times of the polymer solution) containing 10% water, filtered, and dried at 55° C. for 12 h under vacuum giving 37 g of P(S-b-MMA) (97% yield).

Gel permeation chromatography (GPC) was done with equipped with 100 Å, 500 Å, $10^3$ Å, $10^5$ Å and $10^6$ Å µ-ultrastyragel columns showed that the 1' PS block had $M_{n,PS}$ (GPC)=10,400 g/mol and $M_w/M_n$=1.06 with respect to PS calibration standards. The diblock copolymer molecular weight obtained from GPC is $M_{n,P(s-b-MMA)}$=23,400 g/mol and $M_w/M_n$=1.09. The molecular weight of PMMA block calculated by NMR intensities of —OCH$_3$ protons and aromatic protons based on $M_{n,PS}$(GPC) block is: $M_{n,PMMA}$ (NMR)=11,000 g/mol. This corresponds to $V_{f-PS}$=0.51 in the diblock copolymer. The triblock copolymers were also measure by GPC.

Synthesis Example 7a: Synthesis of Oligo Block Copolymer Consisting of Styrene and Methyl Methacrylate for L/S Assembly Additive This oligo block copolymer (S-b-MMA) (20K-23K) was synthesized in manner similar to what was described in synthesis example 7. To achieve target molecular weight the ratio of S-BuLi and monomers were adjusted. Gel permeation chromatography equipped with 100 Å, 500 Å, $10^3$ Å, $10^5$ Å and $10^6$ Å µ-ultrastyragel columns showed that the 1st PS block had Mn,PS (GPC)=20,253 g/mol and Mw/Mn=1.02 with respect to PS calibration standards. The diblock copolymer molecular weight obtained from GPC is Mn,P(S-b-MMA)=41,098 g/mol and Mw/Mn=1.02. The volume fraction determined by NMR was Vf-PS=0.506."

Synthesis Example 8: Synthesis of Oligo(Styrene-co-p-Octylstyrene)-b-(Methyl Methacrylate-co-di (Ethylene Glycol) Methyl Ether Methacrylate) for Contact-Hole Assembly Additive All monomers were distilled in the presence of dehydrating agents into calibrated ampules and stored under $N_2$.

Liquids were transferred into the reactor either via ampule or using stainless steel cannula under $N_2$. Into a dry 1 L round bottom reactor equipped with side arms for connecting ampules, magnetic stir bar, nitrogen/vacuum three-way septum adapter, was added 400 mL dry tetrahydrofuran. The temperature of the reactor was reduced to −78° C. using dry ice-acetone bath. Then, after titrating the impurities, 1.2 mL (0.0016 moles) of sec-butyllithium was added into the reactor. Subsequently, a mixture of styrene (8.92 g, S) and p-octylstyrene (3 g, OS) was added from ampule into the reactor under fast stirring. The reaction solution turned into yellow-orange and the reaction was stirred over 10 min. Subsequently, 0.35 g of 1,1'-diphenylethylene (DPE) in 2.5 ml of dry toluene was added via ampule into the reactor. The orange color of the reaction mixture turned into dark brick-red indicating conversion of styryllithium active centers to delocalized DPE adduct carbanion. After 2 min of stirring, a small amount (2 mL) of the reaction mixture was withdrawn for PS block molecular weight analysis. Then, a mixture of methyl methacrylate (4.82 g, MMA) and di(ethylene glycol) methyl ether methacrylate (1.6 g, DEGMEMA) distilled over a small amount of triethyl aluminum (1M in toluene) and $CaH_2$, respectively, was added via ampule. The reaction was terminated after 15 min with 1 mL of degassed methanol. The block copolymer was recovered by precipitation in excess methanol (5 times of the polymer solution) containing 10% water, filtered, and dried at 55° C. for 12 h under vacuum giving 17 g of oligo(S-co-p-OS)-b-P(MMA-co-DEGMEMA) (94% yield) consisting of 25 mol. % of OS in polystyrene block and 25 mol. % of DEGMEMA in polymethylmethacrylate block. Gel permeation chromatography equipped with 100 Å, 500 Å, $10^3$ Å, $10^5$ Å and $10^6$ Å μ-ultrastyragel columns showed that the $1^{st}$ P(S-co-OS) block had $M_n$ (GPC)=13,000 g/mol and $M_w/M_n$=1.015 with respect to PS calibration standards. The diblock copolymer molecular weight obtained from GPC is $M_{n,P(S-co-p-OS)-b-P(MMA-co-DEGMEMA)}$=19,500 g/mol and $M_w/M_n$=1.04. Theoretical feed ratio of non-polar and polar blocks corresponds to $V_{f-P(S-co-OS)}$=0.70 in the diblock copolymer. The block copolymer exhibited $T_g$=79° C.

Synthesis Example 9: Synthesis of Oligo(Styrene-co-p-Octylstyrene)-b-(Methyl Methacrylate-co-di (Ethylene Glycol) Methyl Ether Methacrylate) (Oligo(S-co-p-OS)-b-P(MMA-co-DEGMEMA)) for L/S Assembly Additive All monomers were distilled in the presence of dehydrating agents into calibrated ampules and stored under $N_2$. Liquids were transferred into the reactor either via ampule or using stainless steel cannula under $N_2$. Into a dry 1 L round bottom reactor equipped with side arms for connecting ampules, magnetic stir bar, nitrogen/vacuum three-way septum adapter, was added 400 mL dry tetrahydrofuran. The temperature of the reactor was reduced to −78° C. using dry ice-acetone bath. Then, after titrating the impurities, 1.0 mL (0.0013 moles) of sec-butyllithium was added into the reactor. Subsequently, a mixture of styrene (10.64 g, S) and p-octylstyrene (1.76 g, OS) was added from ampule into the reactor under fast stirring. The reaction solution turned into yellow-orange and the reaction was stirred over 10 min. Subsequently, 0.32 g of 1,1'-diphenylethylene (DPE) in 2.5 ml of dry toluene was added via ampule into the reactor. The orange color of the reaction mixture turned into dark brick-red indicating conversion of styryllithium active centers to delocalized DPE adduct carbanion. After 2 min of stirring, a small amount (2 mL) of the reaction mixture was withdrawn for PS block molecular weight analysis. Then, a mixture of methyl methacrylate (13.75 ml, 12.87 g, MMA) and di(ethylene glycol) methyl ether methacrylate (2 g, DEGMEMA) distilled over a small amount of triethylaluminum (1M in toluene) and $CaH_2$, respectively, was added via ampule. The reaction was terminated after 15 min with 1 mL of degassed methanol. The block copolymer was recovered by precipitation in excess methanol (5 times of the polymer solution) containing 10% water, filtered, and dried at 55° C. for 12 h under vacuum giving 17 g of oligo(S-co-p-OS)-b-P(MMA-co-DEGMEMA) (94% yield) consisting of 15 mol. % of OS in polystyrene block and 14 mol. % of DEGMEMA in polymethylmethacrylate block. Gel permeation chromatography equipped with 100 Å, 500 Å, $10^3$ Å, $10^5$ Å and $10^6$ Å μ-ultrastyragel columns showed that the $1^{st}$ P(S-co-OS) block had $M_n$ (GPC)=10,800 g/mol and $M_w/M_n$=1.14 with respect to PS calibration standards. The diblock copolymer molecular weight obtained from GPC is $M_{n,P(S-co-p-OS)-b-P(MMA-co-DEGMEMA)}$=30,000 g/mol and $M_w/M_n$=1.07. Theoretical feed ratio of non-polar and polar blocks corresponds to $V_{f-P(S-co-OS)}$=0.50 in the diblock copolymer. The block copolymer exhibited $T_g$=90° C.]

Formulation Examples 1-5 (Form. Ex. 1-5)

Table 1 pertains to formulations of block copolymers of styrene and methyl methacrylate P(S-b-MMA) for use in the formation of contact hole (CH) arrays. Formulations 1 to 5, respectively either containing, no additive (Form. Ex. 1), an oligomeric random copolymer of styrene and methyl methacrylate (Form. Ex 2 and 3) or the oligomer(styrene-co-p-octylstyrene)-b-(methyl methacrylate-co-di(ethylene glycol) methyl ether methacrylate) [oligo(P(S-co-p-OS)-b-P(MMA-co-DEGMEMA))] (Form. 4 and 5). These formulations were prepared by individually dissolving the block copolymers P(S-b-MMA) (78k-39K) (Synthesis example 2) and P(S-b-MMA) (34K-17K) (Synthesis example 3) in propylene glycol methyl ether acetate (PGMEA) to form a 2.0 wt. % solutions. These solutions were then combined and diluted to 1.5 wt. % using PGMEA. In formulation Example 1, containing no additives, the solution was then filtered using a PTFE membrane. For formulations 2-5, an additive, oligo(S-co-MMA) (Form. Ex. 2 and 3) or Oligo(S-co-p-OS)-b-P(MMA-co-DEGMEMA) (Form. Ex. 4 and 5) was added, as indicated, in Table 1, prior to filtering with a PTFE membrane.

Formulation Examples 6-9 and Comparative Formulations 1-3

Table 2 pertains to formulations of block copolymers of styrene and methyl methacrylate P(S-b-MMA) for use in the formation of contact hole (CH) self-assembly. Formulations 6 to 9, respectively either containing no additive (Form. Ex 6), or the additive oligo(S-co-MMA) (Form. Ex. 7, 8, and 9)

or for Comparative Formulation Examples 1 to 3 a random high molecular with copolymer of styrene and methyl methacrylate P(MMA-co-S) [Comp. Form. Ex. 1, 2 and 3). These formulations were prepared by dissolving the block copolymer of styrene and methyl methacrylate P(S-b-MMA) (42K-47K) (Synthesis example 4) in PGMEA to form a 2.0 wt. % solution. This solution was then combined and diluted to 1.5 wt. % using PGMEA. In formulation Example 6, containing no additives, the solution was then filtered using a PTFE membrane. For Formulation Examples 7 to 9, (Form. Ex. 7 to 9) the additives oligo P(S-co-MMA) (Synthesis Example 9) or in Comparative Examples 1 to 3 (Comp. Ex. 1-9) the high Molecular weight random copolymer of styrene and methyl methacrylate P(S-co-MMA) (Comparative Synthesis Example 1) (Comp. Synth. Ex. 1) were respectively added, as indicated in Table 2, prior to filtering with a PTFE membrane.

Formulation Examples 6, 10-14

Table 3 pertains to formulations of block copolymers of styrene and methyl methacrylate P(S-b-MMA) for use in the formation of contact hole Line and Space (L/S) Arrays. These formulations were prepared by dissolving the block copolymer of styrene and methyl methacrylate P(S-b-MMA) (42K-47K) (Synthesis example 4) in PGMEA to form a 2.0 wt. % solution. These solutions were then combined and diluted to 1.5 wt. % using PGMEA. In formulation Example 6, containing no additives, the solution was then filtered using a PTFE membrane. For Formulation Examples 10 to 12, (Form. Ex. 10 to 12) the additives Oligo(S-co-p-OS)-b-P(MMA-co-DEGMEMA) or for Formulation Examples 13 to 14 the oligomeric block copolymer of styrene and methyl methacrylate oligo(S-b-MMA) were respectively added, as indicated in Table 3, prior to filtering with a PTFE membrane.

Formulation Examples 15, 16 and Comparative Formulation Example 4

Preparation of Stock Solutions

A first stock solution (3.2 wt %) of the ABA triblock copolymer was prepared by dissolving 0.6 g of Synthesis examples 4a into 18 g of PGMEA and filtering the solution.

A second stock solution (3.2 wt %) was prepared of the Oligomeric block copolymer of Synthesis Example 9 by dissolving 0.6 g of this material into 18 g of PGMEA and filtering the solution.

A third stock solution was prepared of the Oligomeric block copolymer of Synthesis Example 7a by dissolving 0.83 g of this material into 25 g of PGMEA and filtering the solution.

Comparative Formulation Example 4

The first stock solution was used as Comparative Example 4, a solution of only the Triblock copolymer which was used to establish the defect levels found during self-assembly the this triblock copolymer without the addition of oligomeric additive component.

Formulation Example 15

This Formulation was prepared by combining 4.6 g of the first stock solution containing the Synthesis Example 4a with 0.92 g of the second stock solution. This solution was used to show the effect of the oligomeric block copolymer of component type 2-b) (Synthesis Example 9) on the defect levels found during self-assembly of the triblock copolymer.

Formulation Example 16

This Formulation was prepared by combining 5.4 g of the first stock solution containing the Synthesis Example 4a with 1.08 g of the second stock solution. This solution was used to show the effect of the oligomeric block copolymer of component type 3-b) (Synthesis Example 4a) on the defect levels found during self-assembly of the triblock copolymer.

Processing of Comparative Example 4, Formulation Example 15 and Formulation Example 16

These Formulation were filtered through a 0.2 m Teflon filter prior to coating. Coating was done using a TEL ACT 8 track on a 8" Silicon Wafer which was previously coated with a Neutral Layer (see below), and then soft baked at 110° C. for 1 min and hard baked at 250° C. for 1 hour.
Neutral Layer In testing all block copolymer formulations, a silicon wafer was first coating with a neutral layer formulation Neutral Layer Formulation 1 which was prepared by dissolving the polymer of Synthetic Example 1 into PGMEA to form a neutral layer formulations used for coating wafer overcoated as follows: The neutral layer was formed by casting Neutral Formulation Example 1 (74% PS) on a silicon wafer and baking it at 240° C./5 min followed by a rinse for 30 s with PGMEA, and a bake 110° C. for 1 min.
Self-Assembly Film Processing Unless otherwise indicated the formulation for self-assembly described herein were spun at 1500 rpm on top of the neutral layer to form a film having a thickness of ~50 nm and were then baked at 250° C. for 5 min under Nitrogen to affect self-assembly. After self-assembly, these films were then etched with an oxygen plasma for at time between 0 to 70 seconds as indicated in specific FIGS. and Table herein. The oxygen etch was done with a Norsdson March etcher RF power=50 (W), Base pressure=50 (mTorr), Process pressure=90 (mTorr), $O_2$=15 (sccm).
Self-Assembly and Etching Results
CH Formulation Results Formulation of blends P(S-b-MMA) polymers containing up to 30 wt. % oligomer additives, as shown in the examples in Table 1, decreased the defects seen after oxygen plasma etching up to 3 times compared to reference samples not containing these additives.

Specifically, FIG. 1 shows a top down SEM study (2 m FOV) of the self-assembly and etching of the CH block copolymer formulations of poly(styrene-block-methyl methacrylate) [blend of P(S-b-MMA) (78K-b-39K) and ((34K-b-17K)] described in Table 1 when these are cast as films on a neutral layer. These results illustrated the effect of adding the additive oligo(S-co-MMA) from 0 to 20 wt. %, in 50 nm films of these formulations (~1 $L_o$) when they are coated on a neutral layer, annealed at 250° C., to induce self-assembly, and etched. These films were etched with an oxygen plasma for either 50 or 70 seconds. In these etched self-assembled films, the number of defects observed decrease greatly with increasing loading of this oligomeric additive. In contrast, formulations containing none of this additive showed a much greater number of defects.

Similarly, FIG. 2 shows a x-section SEM view (250 magnification) of self-assembled films of this CH formulation after etching for 20 seconds wherein the number of defect decreased going from a loading of 10 to 20 wt. % of this additive.

Figure 3:
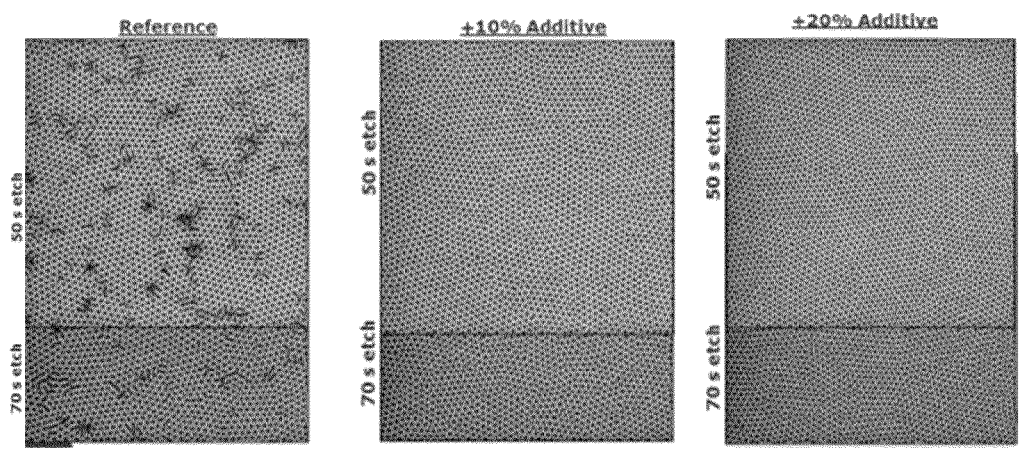

FIG. 3, shows a top down SEM CH defect similar to the study discussed above for FIG. 1. However, in this instance the additive used was oligo(S-co-p-OS)-b-P(MMA-co-DE-GMEMA) [Synth. Ex. 8] instead of oligo(S-co-MMA). The use of oligo(S-co-p-OS)-b-P(MMA-co-DEGMEMA) was also seen to greatly decrease the number of defect observed, as the loading was increased from 0 wt. % to 20 wt. % as shown in FIG. 3.

L/S Formulation Results

FIG. 4. shows a top down SEM L/S study of self-assembled films of the block copolymer P(S-b-MMA) (45.4k-b-51k) formulated either without oligo(S-co-p-OS)-b-P(MMA-co-DEGMEMA) or with 10, 20 or 30 wt. % of this additive [Synth. Ex. 9] when these are cast on a neutral layer. These Formulations are respectively Formulation 6, 7, 8 and 9 in Table 3. After these self-assembled films were etched with an oxygen plasma for 30, 50 or 70 seconds, the sample without the additive showed a great number of defects, while in contrast the samples with 10 wt. % or 20 wt. % of this additive showed almost no defect even after etching for 70 seconds.

FIG. 5. shows a top down SEM L/S study of self-assembled films of the block copolymer P(S-b-MMA) (45.4k-b-51k) formulated either without (a.k.a. 0 wt. %) or with oligo(S-b-MMA) (10, or 20 wt. %) of this additive [Synth. Ex. 7] when these are cast on a neutral layer. These Formulations are respectively Formulation 6 (0 wt. %), 13 (10 wt. %) and 14 (20 wt. %) in Table 3. After these self-assembled films were etched with an oxygen plasma for 30 seconds, the sample without the additive (0 wt. %) showed a great number of defects, while in contrast the samples with 10 wt. % or 20 wt. % of this additive showed no significant defects even after etching for 30 seconds.

Tables 4 and 5 summarize the defect results obtained after self-assembly and etch for the L/S formulations described in Table 2. Respectively, Tables 4 and 5 compare the defect results obtained after self-assembly and oxygen plasma etching for films of the formulations (Form. Ex. 7, 8 and 9) of the block copolymer P(S-b-MMA) (45.4k-b-51k) cast on a neutral layer containing the low $T_g$ additive oligo(S-co-MMA) [Synth Ex. 6] compared to films cast from formulations containing the same loadings of the high $T_g$ high Molecular weight Additive P(S-co-MMA) [Comp. Synth. Ex. 1] (Form. Comp. 1, 2 and 3) at loadings ranging from 10 wt. % to 30 wt. %. This showed that unexpectedly oligo(S-co-MMA) [Synth Ex. 7] gave a much lower number average network assembly defects per micron$^2$ (def/μm$^2$) than the formulations containing P(S-co-MMA) [Comp. Synth. Ex. 1].

FIG. 6. shows a top down SEM L/S study of self-assembled films of the block copolymer P(MMA-b-S-b-MMA) (50k-88k-50k) formulated either without additive (a.k.a. 0 wt. %); with (oligo(S-co-p-OS)-b-P(MMA-co-DE-GMEMA) (20 wt. %) of this additive, [Synth Ex 9] or with oligo(S-b-MMA) (20 wt. %) of this additive [Synth. Ex. 7a] when these are cast on a neutral layer. These last two Formulations are respectively Formulation 15 (20 wt. %) and 16 (20 wt. %) in Table 3. After these self-assembled films were etched with an oxygen plasma for 30 seconds. The defect numbers for these 3Lo FT with 3L0 self-assembled film were obtained using Hitachi DSA APPS software. The sample without the additive (0 wt. %) showed a great number of defects (101 defects), while in contrast the samples with 20 wt. % of (oligo(S-co-p-OS)-b-P(MMA-co-DEGMEMA) or 20 wt. % of oligo(S-b-MMA) showed respectively only defect levels of 7 and 15.

TABLE 1

Contact Hole (CH) Formulations containing oligomer P(S-co-MA) or oligomer P(S-co-p-OS)-b-P(MMA-co-DEGMEMA)

| Comp. Type | Comp. Ex. # | Form. Ex. 1 (Ref.) wt. % (0 wt. % additive) | Form. Ex. 2 wt. % (10 wt. % additive) | Form. Ex. 3 wt. % (20 wt. % additive) | Form. Ex. 4 wt. % (10 wt. % additive) | Form. Ex. 5 wt. % (20 wt. % additive) |
|---|---|---|---|---|---|---|
| PS-b-PMMA (78K-39K) Synthesis example 2 | Synth. Ex. 2 | 0.971 | 0.971 | 0.971 | 0.971 | 0.971 |
| PS-b-PMMA (34K-17K) Synthesis example 3 | Synth. Ex. 3 | 0.083 | 0.083 | 0.083 | 0.083 | 0.083 |
| Oligo (S-co-MA) | Synth. Ex. 5 | 0 | 0.13 | 0.26 | | |
| Oligo (S-co-p-OS)-b-P(MMA-co-DEGMEMA) | Synth. Ex. 8 | 0 | | | 0.13 | 0.26 |
| PGMEA | | 98.69 | 98.56 | 98.43 | 98.56 | 98.43 |

TABLE 2

Line and Space (L/S) Formulations containing oligo(S-co-MA)
and Comparative Formulations 1-3 containing P(S-co-MA)

| Comp. Type | Ex. # | Form. Ex. 6 (Ref.) wt. % (0 wt. % additive) | Form. Ex. 7 wt. % (10 wt. % additive) | Form. Ex. 8 wt. % (20 wt. % additive) | Form. Ex. 9 wt. % (30 wt. % additive) | Form. Comp. Ex. 1 wt. % (10 wt. % additive) | Form. Comp. Ex. 2 wt. % (20 wt. % additive) | Form. Comp. Ex. 3 wt. % (30 wt. % additive) |
|---|---|---|---|---|---|---|---|---|
| P(S-b-MMA) (42K-b-47K) | Synth. Ex. 4 | 1.31 | 1.31 | 1.31 | 1.31 | 1.31 | 1.31 | 1.31 |
| Oligo (S-co-MMA) | Synth. Ex. 6 | | 0.13 | 0.26 | 0.56 | | | |
| P(S-co-MMA) | Comp. Synth. Ex. 1 | | | | | 0.13 | 0.26 | 0.56 |
| PGMEA | | 98.69 | 98.56 | 98.43 | 98.13 | 98.56 | 98.43 | 98.13 |

TABLE 3

Line and Space (L/S) Formulations containing oligo
(S-co-p-OS)-b-P(MMA-co-DEGMEMA) or oligo(S-b-MMA)

| Comp. Type | Comp. Ex. # | Form. Ex. 6 (Ref.) wt. % (0 wt. % additive) | Form. Ex. 10 wt. % (10 wt. % additive) | Form. Ex. 11 wt. %. (20 wt. % additive) | Form. Ex. 12 wt. %. (30 wt. % additive) | Form. Ex. 13 wt. %. (10 wt. % additive) | Form. Ex. 14 wt. %. (20 wt. % additive) | Form. Ex. 15 wt. %. (20 wt. % additive) | Form. Ex. 16 wt. %. (20 wt. % additive) |
|---|---|---|---|---|---|---|---|---|---|
| P(MMA-b-S-b-MMA) | Synth Ex 4a | | | | | | | 1.31 | 1.31 |
| P(S-b-MMA) (42K-47K) | Synth. Ex. 4 | 1.31 | 1.31 | 1.31 | 1.31 | 1.31 | 1.31 | | |
| Oligo (S-co-p-OS)-b-P(MMA-co-DEGMEMA) | Synth Ex. 9 | 0 | 0.13 | 0.26 | 0.56 | | | | 0.26 |
| Oligo (S-b-MMA) | Synth Ex. 7 | | | | | 0.13 | 0.26 | 0.26 | |
| Oligo (S-b-MMA) | Synth Ex. 7a | | | | | | | | |
| PGMEA | | 98.69 | 98.56 | 98.43 | 98.13 | 98.56 | 98.43 | 98.43 | 98.43 |

TABLE 4

Defect Results for P(S-b-MMA) (45.4k-b-51k) Formulations
with and without additive oligo (S-co-MMA)

| Form. Ex. 7 | Ave. def. at 2 μm FOV | | | def/μm$^2$ | | |
|---|---|---|---|---|---|---|
| Wt. % | 1LoFT | 2LoFT | 3LoFT | 1LoFT | 2LoFT | 3LoFT |
| 0 | — | 9.2 | 13.6 | — | 2.3 | 3.4 |
| 10 | — | 5.2 | 9.6 | — | 1.3 | 2.4 |
| 20 | — | 1.8 | 6.2 | — | 0.45 | 1.55 |
| 30 | — | 1.2 | 6.4 | — | 0.3 | 1.6 |

TABLE 5

Defect Results for P(S-b-MMA) (45.4k-b-51k) Formulations
with and without high Molecular weight (19.6K) P (S-co-MMA)

| Comp Form. EX. 1 | Ave. def. at 2 μm FOV | | | def/μm$^2$ | | |
|---|---|---|---|---|---|---|
| Wt. % | 1LoFT | 2LoFT | 3LoFT | 1LoFT | 2LoFT | 3LoFT |
| 0 | — | 9.4 | 14.0 | — | 2.35 | 3.5 |
| 10 | — | 6.6 | 9.8 | — | 1.65 | 2.45 |
| 20 | — | 3.8 | 9.0 | — | 0.95 | 2.25 |
| 30 | — | 3.6 | 7.8 | — | 0.9 | 1.95 |

The invention claimed is:
1. A composition comprising components a), b) and c), wherein
- a) is a block copolymer component or blend of at least two block copolymers,
- b) is a low $T_g$ additive selected from the group consisting of
  - an oligo random copolymer b-1), made by radical polymerization using an (E)-2,2'-(diazene-1,2-diyl) bis(2-alkylpropanenitrile radical initiator and an alkyl thiol chain transfer agent,
  - an oligo diblock copolymer b-2), made by anionic polymerization using an alkyl lithium initiator,
  - an oligo diblock copolymer b-3), made by anionic polymerization using an alkyl lithium initiator, and mixture thereof, wherein further;
- b-1) is an oligo random copolymer, of two repeat units, which have structure (Ib) and structure (IIb), wherein $R_{1b}$ and $R_{3b}$ are independently selected from H or a C-1 to C-4 alkyl, $R_{2b}$ is H or a C-1 to C-8 alkyl, $R_{4b}$ is a C-1 to C-8 alkyl, and
- the mole % values, based on the total moles of repeat units of structures (Ib) and (IIb), are for the repeat units of structure (Ib) from about 40 mole % to about 80 mole % and for the repeat units of structure (IIb) from about 20 mole % to about 60 mole %, and
- wherein the individual values of the mole % for the repeat units of structures (Ib) and (IIb) are selected from their respective ranges to add up to 100 mole % of the total moles of repeat units of structures (Ib) and (IIb); and further
- said oligo random copolymer b-1) has a $T_g$ which is from about 0° C. to about 80° C., and
- has an $M_n$ which is from about 1000 g/mole to about 8000 g/mole, and
- has a polydispersity from about 1.3 to about 1.8,

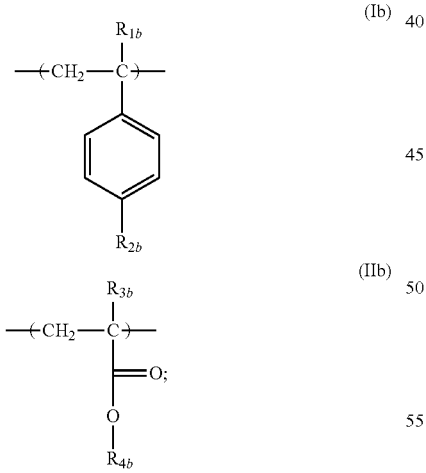

b-2) is an oligo diblock copolymer of block A-b) and block B-b), having an $M_n$ from about 1,000 to 35,000, and a polydispersity from 1.0 to about 1.1, wherein block A-b) is a random copolymer of repeat units having structures (III), and (IV), and block B-b) is a random copolymer of repeat units having structures (V), and (VI), and $R_5$, $R_7$, $R_9$, and $R_{11}$, are independently selected from H or a C-1 to C-4 alkyl, $R_6$ is a C-7 to C-10 linear alkyl, $R_8$ is a C-1 to C-4 alkyl, $R_{10}$ is a C-1 to C-4 alkyl, $R_{12}$ and $R_{13}$ are individually selected from a C-2 to C-5 alkylene, and $R_{14}$ is a C-1 to C-4 alkyl, and said oligo diblock copolymer b-2) has a $T_g$ which has a value from about 0° C. to about 95° C.,

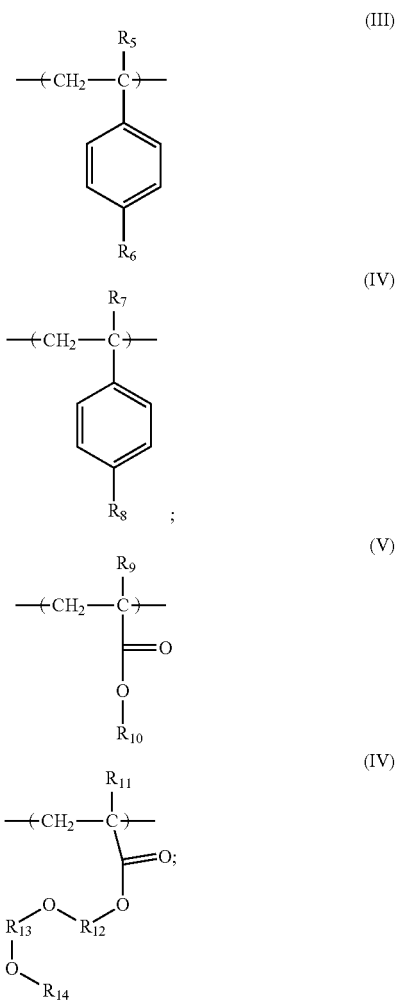

and
b-3) is an oligo diblock copolymer of block A-c), with repeat units having structure (Ic), and a block B-c), with repeat units having structure (IIc), wherein $R_{1c}$ and $R_{3c}$ are independently selected from H or a C-1 to C-4 alkyl, $R_{2c}$ is H or a C-1 to C-8 alkyl, $R_{4c}$ is a C-1 to C-8 alkyl, and
the mole % values, based on the total moles of repeat units of structures (Ic) and (IIc), are for the repeat units of structure (Ic) from about 36 mole % to about 74 mole % and for the repeat units of structure (IIc) from about 26 mole % to about 64 mole %, and the individual values of the mole % for the repeat units of structures (Ic) and (IIc) are selected from their respective ranges to add up to 100 mole % of the total moles of repeat units of structures (Ic) and (IIc), and
said oligo diblock copolymer b-3) has an $M_n$ from about 1000 g/mole to 23,400 g/mole, a polydispersity from about 1.0 to about 1.1, and a $T_g$ from about 0° C. to 90° C.,

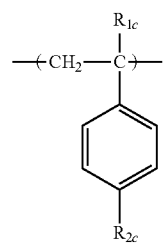 (Ic)

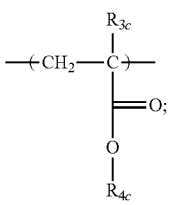 (IIc)

c) is a spin casting organic solvent.

2. The composition of claim 1, wherein said component a) is selected from either a single triblock copolymer and blends of at least two triblock copolymers, or a single diblock copolymer and blends of at least two diblock copolymers.

3. The composition of claim 1, wherein said component a) is an ABA triblock copolymer component selected from the group consisting of ABA triblock copolymer a-1t), a ABA triblock copolymer a-2t) and a blend of ABA triblock polymer a-1t) and ABA triblock copolymer a-2t), wherein a-1t) is an ABA triblock copolymer, comprising a middle B) styrenic block segment of repeat units having styrenic structure (I), and two end acrylic block A) segments of equal length having structure (II), wherein $R_1$ and $R_3$ are independently selected from H and C-1 to C-4 alkyl, $R_2$ is H or a C-1 to C-8 alkyl, $R_4$ is a C-1 to C-8 alkyl, and the mole % values, based on the total moles of repeat units of structures (I) and (II), are for the repeat units of structure (I) from about 40 mole % to about 80 mole % and for the repeat units of structure (II) from about 20 mole % to about 60 mole %, wherein the individual values of the mole % for the repeat units of structures (I) and (II) are selected from their respective ranges to add up to 100 mole % of the total moles of repeat units of structures (I) and (II), and said triblock copolymer a-1t) has a polydispersity from about 1.0 to about 1.1 and has an $M_n$ from about 70,000 g/mole to about 350,000 g/mole,

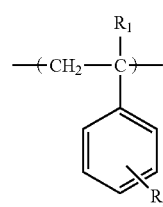 (I)

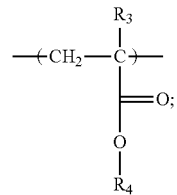 (II)

a-2t) is an ABA triblock copolymer, comprising a middle B) block segment of repeat units having styrenic structure (Ia), and two end block B) segments of equal length having acrylic structure (IIa), wherein $R_{1a}$ and $R_{3a}$ are independently selected from H and C-1 to C-4 alkyl, $R_{2a}$ is H or a C-1 to C-8 alkyl, $R_{4a}$ is a C-1 to C-8 alkyl, the mole % values, based on the total moles of repeat units of structures (Ia) and (IIa), are for the repeat units of structure (Ia) from about 40 mole % to about 80 mole % and for the repeat units of structure (IIa) from about 20 mole % to about 60 mole %, and wherein the individual values of the mole % for the repeat units of structures (Ia) and (IIa) are selected from their respective ranges to add up to 100 mole % of the total moles of repeat units of structures (Ia) and (IIa), and said triblock copolymer a-2t) has a polydispersity from about 1.0 to about 1.1, has an $M_n$ from about 70,000 g/mole to about 350,000 g/mol,

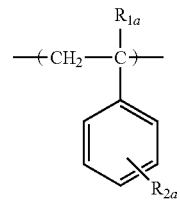 (Ia)

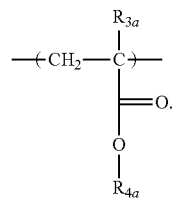 (IIa)

4. The composition of claim 1, wherein component a) is a triblock copolymer selected from a triblock copolymer of structure (ABA-1), a triblock copolymer of structure (ABA-2) and a mixture of these two block copolymers, wherein mt, mta, nt and nta are the number of repeat units, $R_{1s}$, $R_{1sa}$, $R_{2s}$, and $R_{2sa}$ are independently selected from hydrogen, a C-1 to C-8 alkyl, $-N(R_{3s})_2$, $-OR_{4s}$, and $Si(R_{5s})_3$, wherein $R_{3s}$, $R_{4s}$ and $R_{5s}$ are independently selected from a C-1 to C-4 alkyl,

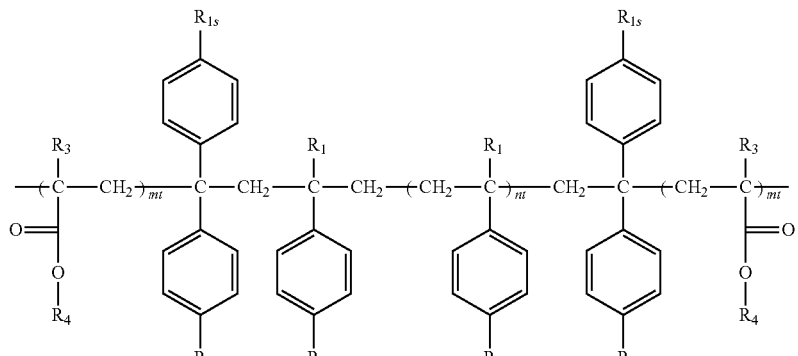

(ABA-1)

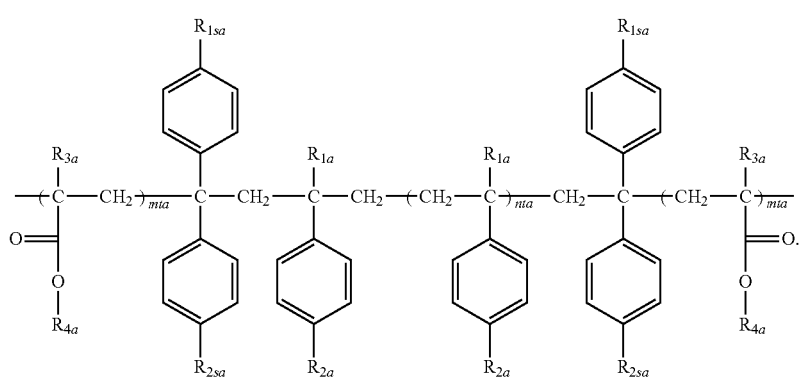

(ABA-2)

5. The composition of claim 1, wherein a) is a diblock copolymer component selected from the group consisting of diblock copolymer a-1), diblock copolymer a-2) and a blend of a-1) and a-2), wherein a-1) is a diblock copolymer of block A), with styrenic repeat units having styrenic structure (I), and block B), having acrylic structure (II), wherein $R_1$ and $R_3$ are independently selected from H and C-1 to C-4 alkyl, $R_2$ is H or a C-1 to C-8 alkyl, $R_4$ is a C-1 to C-8 alkyl, and the mole % values, based on the total moles of repeat units of structures (I) and (II), are for the repeat units of structure (I) from about 40 mole % to about 80 mole % and for the repeat units of structure (II) from about 20 mole % to about 60 mole %, wherein the individual values of the mole % for the repeat units of structures (I) and (II) are selected from their respective ranges to add up to 100 mole % of the total moles of repeat units of structures (I) and (II), and said diblock copolymer a-1) has a polydispersity from about 1.0 to about 1.1 has an $M_n$ from 50,000 g/mole to about 150,000 g/mole,

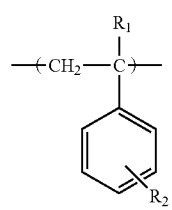

(I)

-continued

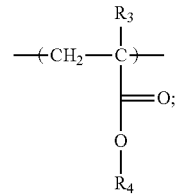

(II)

a-2) is a di-block copolymer of a block A-a), with repeat units having styrenic structure (Ia), and block B-a), with repeat units having acrylic structure (IIa), wherein $R_{1a}$ and $R_{3a}$ are independently selected from H or a C-1 to C-4 alkyl, $R_{2a}$ is H or a C-1 to C-8 alkyl, $C_{4a}$ is a C-1 to C-8 alkyl and, the mole % values, based on the total moles of repeat units of structures (Ia) and (IIa), are for the repeat units of structure (Ia) from about 40 mole % to about 80 mole % and for the repeat units of structure (IIa) from about 20 mole % to about 60 mole %, and wherein the individual values of the mole % for the repeat units of structures (Ia) and (IIa) are selected from their respective ranges to add up to 100 mole % of the total moles of repeat units of structures (Ia) and (IIa), and said diblock copolymer a-2) has a polydispersity from about 1.0 to about 1.1, has an $M_n$ from about 30,000 g/mole to about 90,000 g/mole,

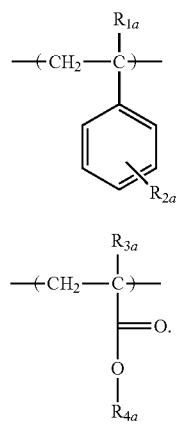

(Ia)

(IIa)

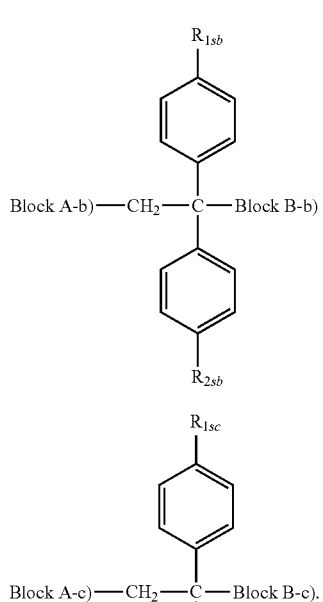

(I-S-b)

(I-S-c)

6. The composition of claim 5, wherein the diblock copolymers a-1) and a-2), respectively, have structure (I-S), and structure (I-S-a), wherein $R_{1s}$, $R_{1sa}$, $R_{2s}$, and $R_{2sa}$ are independently selected from hydrogen, a C-1 to C-8 alkyl, $-N(R_{3s})_2$, $-OR_{4s}$, and $Si(R_{5s})_3$, wherein $R_{3s}$, $R_{4s}$ and $R_{5s}$ are independently selected from a C-1 to C-4 alkyl,

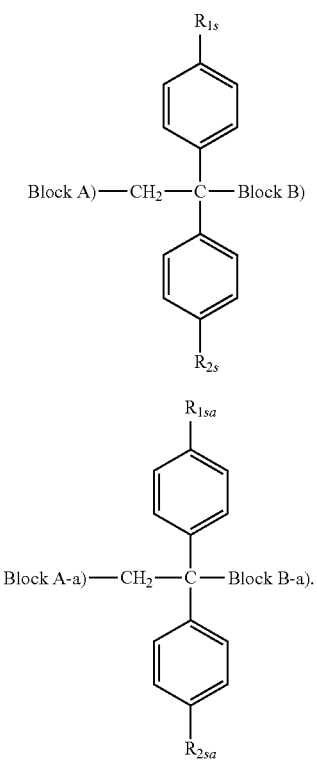

(I-S)

(I-S-a)

7. The composition of claim 1, wherein the oligo diblock copolymer components b-2) and b-3) have a spacer moiety, respectively between block A-b) and block B-b) or between block A-c) and block B-c) as shown, respectively, in structure (I-S-b), and structure (I-S-c) wherein $R_{1sb}$, $R_{1sc}$, $R_{2sb}$, and $R_{2sc}$ are independently selected from hydrogen, a C-1 to C-8 alkyl, $-N(R_{3s})_2$, $-OR_{4s}$, $Si(R_{5s})_3$, wherein $R_{3s}$, $R_{4s}$ and $R_{5s}$ are independently selected from a C-1 to C-4 alkyl, 8. The composition of claim 5, wherein for component a) the diblock copolymer component a-1), has a polydispersity from about 1.00 to about 1.03.

9. The composition of claim 5, wherein for component a) the diblock copolymer component a-1), the mole % values, for the repeat units of structure (I) are from about 40 mole % to about 60 mole % and for the repeat units of structure (II) from about 40 mole % to about 60 mole %.

10. The composition of claim 5, wherein for component a) the diblock copolymer component a-1), the mole % values, for the repeat units of structure (I) are from about 60 mole % to about 75 mole % and for the repeat units of structure (II) from about 25 mole % to about 40 mole %.

11. The composition of claim 5, wherein for component a) the diblock copolymer component a-2), has a polydispersity from 1.00 to about 1.03.

12. The composition of claim 5, wherein for component a) the total mole % values, for the repeat units of structures (I) and (Ia) is from about 40 mole % to about 60 mole % and the total mole % value, for the repeat units of structures (II) and (IIa) is from about 40 mole % to about 60 mole % in for either a single block copolymer a-1) or a-2) or in a blend of a-1) and a-2).

13. The composition of claim 5, wherein for component a) the total mole % values, for the repeat units of structures (I) and (Ia) is from about 60 mole % to about 75 mole % and the total mole % value, for the repeat units of structures (II) and (IIa) is from about 25 mole % to about 40 mole % for either a single block copolymer a-1) or a-2) or in a blend of a-1) and a-2).

14. The composition of claim 5, wherein component a) is a blend of a-1) and a-2).

15. The composition of claim 5, wherein component a) is either a-1) or a-2).

16. The composition of claim 1, wherein for component b), the oligo random copolymer b-1), has a polydispersity from about 1.3 to about 1.5.

17. The composition of claim 1, wherein for component b), the oligo random copolymer b-1), has an $M_n$ from about 1000 g/mole to about 5000 g/mole.

18. The composition of claim 1, wherein for component b), the oligo random copolymer b-1), has a $T_g$ from about 50° C. to about 80° C.

19. The composition of claim 1, wherein component b) is oligo random copolymer b-1).

20. The composition of claim 1, wherein for component b), the oligo diblock copolymer b-2) it is one in which $R_5$, $R_7$ and $R_8$ are H, $R_6$ is n-octyl or n-nonyl, $R_9$ and $R_{11}$ are methyl, $R_{10}$ is methyl or ethyl, $R_{12}$ and $R_{13}$ are independently ethylene or propylene, and $R_{14}$ is methyl or ethyl.

21. The composition of claim 1, wherein for component b), the oligo diblock copolymer b-2) it is one in which $R_6$ is n-octyl, $R_{10}$ is methyl, $R_{12}$ and $R_{13}$ are ethylene, and $R_{14}$ is methyl.

22. The composition of claim 1, wherein for component b), the oligo diblock copolymer b-2) it is one wherein,
said mole % for the repeat units of structure (IV) is from about 25 mole % to about 50 mole %, and
said mole % for the repeat units of structure (V) is from about 40 mole % to about 60 mole %.

23. The composition of claim 1, wherein for component b), the oligo diblock copolymer b-2) it is one wherein,
said mole % for the repeat unit of structure (III) its mole % is from about 20% to about 30% of the mole % of the repeat unit of structure (IV), and
for the repeat unit of structure (VI) its mole % is from about 12% to about 20% of the mole % of the repeat unit of structure (V).

24. The composition of claim 1, wherein for component b), the oligo diblock copolymer b-2), has a polydispersity from about 1.03 to about 1.08.

25. The composition of claim 1, wherein for component b), the oligo diblock copolymer b-2), has an $M_n$ from about 15000 g/mole to about 32000 g/mole.

26. The composition of claim 1, wherein for component b), the oligo diblock copolymer b-2), has a $T_g$ from about 50° C. to about 90° C.

27. The composition of claim 1, wherein component b) is oligo diblock copolymer b-2).

28. The composition of claim 1, wherein for component b), the oligo diblock copolymer b-3) has an $M_n$ from about 15,000 to 23,400 g/mole.

29. The composition of claim 1, wherein for component b), the oligo diblock copolymer b-3), has a polydispersity from about 1.02 to about 1.08.

30. The composition of claim 1, wherein component b), is the oligo diblock copolymer b-3), and it is one wherein,
said mole % for the repeat units of structure (Ic) is from about 40 mole % to about 70 mole %, and said mole % for the repeat units of structure (IIc) is from about 40 mole % to about 70 mole %.

31. The composition of claim 1, wherein for component b), the oligo diblock copolymer b-3), has a $T_g$ from about 50° C. to 90° C.

32. The composition of claim 1, wherein component b) is oligo diblock copolymer b-3).

33. The composition of claim 5, wherein component a) is a diblock copolymer component selected from the group consisting of diblock copolymer a-1), diblock copolymer a-2) and a blend of a-1) and a-2), whose total mole % of styrenic repeat units of structures (I) and (Ia) is from about 60 mole % to about 75 mole % and whose total mole % of acrylic repeat units of structure (II) and (IIa) is from about 40 mole % to about 60 mole % and component b) is copolymer b-1), oligo diblock copolymer b-2) or copolymer b-3).

34. The composition of claim 5, wherein component a) is a diblock copolymer component selected from the group consisting of diblock copolymer a-1), diblock copolymer a-2) and a blend of a-1) and a-2), whose total mole % of styrenic repeat units of structure (I) and (Ia) is from about 60 mole % to about 75 mole % and further wherein the total mole % of the acrylic repeat units of structures (II) and (IIa) is from about 25 mole % to about 40 mole % and component b) is oligo random copolymer b-1), oligo diblock copolymer b-2), or oligo diblock copolymer b-3).

35. The composition of claim 5, wherein component a) is selected from the group consisting of triblock copolymer component a-1t), triblock copolymer a-2t) and a blend of a-1t) and a-2t) whose total mole % of styrenic repeat units of structures (I) and (Ia) is from about 60 mole % to about 75 mole % and whose total mole % of acrylic repeat units of structure (II) and (IIa) is from about 40 mole % to about 60 mole %, and component b) is copolymer b-2 or oligo diblock copolymer b-3).

36. The composition of claim 5, wherein component a) is selected from the group consisting of triblock copolymer component a-1t), triblock copolymer a-2t) and a blend of a-1t) and a-2t) whose total mole % of styrenic repeat units of structure (I) and (Ia) is from about 60 mole % to about 75 mole % and further wherein the total mole % of the acrylic repeat units of structures (II) and (IIa) is from about 25 mole % to about 40 mole % and component b) is oligo diblock copolymer b-2), or oligo diblock copolymer b-3).

37. A process comprising steps:
i) forming a coating of a neutral layer on a substrate,
ii) coating the composition of claim 1, onto said neutral layer, to form a film
ii) baking said film, in an inert gas atmosphere, at a temperature selected from about 240° C. to about 260° C., to form a self-assembled film, and
iii) etching said substrate with a plasma to pattern transfer said self-assembled film into the substrate.

38. A process for forming a line and space array comprising steps:
ia) forming a coating of a neutral layer on a substrate,
iia) coating the composition of claim 33, onto said neutral layer, to form a film
iiia) baking said film, in an inert gas atmosphere, at a temperature selected from about 240° C. to about 260° C., to form a self-assembled film, and
iva) etching said substrate with a plasma to pattern transfer said self-assembled film into the substrate.

39. A process for forming a contact hole array comprising steps:
ib) forming a coating of a neutral layer on a substrate,
iib) coating the composition of claim 34 onto said neutral layer, to form a film,
iiib) baking said film, in an inert gas atmosphere, at a temperature selected from about 240° C. to about 260° C., to form a self-assembled film, and
ivb) etching said substrate with a plasma to pattern transfer said self-assembled film into the substrate.

40. A process for forming a line and space array comprising steps:
ic) forming a coating of a neutral layer on a substrate,
iiic) coating the composition of claim 35, onto said neutral layer, to form a film, ivc) baking said film, in an inert gas atmosphere, at a temperature selected from about 240° C. to about 260° C., to form a self-assembled film, and vc) etching said substrate with a plasma to pattern transfer said self-assembled film into the substrate.

41. A process for forming a contract hole array comprising steps:

id) forming a coating of a neutral layer on a substrate, iiid) coating the composition of claim 36, onto said neutral layer, to form a film, ivd) baking said film, in an inert gas atmosphere, at a temperature selected from about 240° C. to about 260° C., to form a self-assembled film, and vd) etching said substrate with a plasma to pattern transfer said self-assembled film into the substrate.

42. A composition comprising components a), b) and c), wherein a) is a block copolymer component or blend of at least two block copolymers, b) is a low $T_g$ additive selected from the group consisting of an oligo random copolymer b-1), made by radical polymerization using an (E)-2,2'-(diazene-1,2-diyl)bis(2-alkylpropanenitrile radical initiator and an alkyl thiol chain transfer agent, an oligo diblock copolymer b-2), made by anionic polymerization using an alkyl lithium initiator, an oligo diblock copolymer b-3), made by anionic polymerization using an alkyl lithium initiator, and mixture thereof, wherein;

b-1) is an oligo random copolymer, of two repeat units, which have structure (Ib) and structure (IIb), wherein $R_{1b}$ and $R_{3b}$ are independently selected from H or a C-1 to C-4 alkyl, $R_{2b}$ is H or a C-1 to C-8 alkyl, $R_{4b}$ is a C-1 to C-8 alkyl, and the mole % values, based on the total moles of repeat units of structures (Ib) and (IIb), are for the repeat units of structure (Ib) from about 40 mole % to about 80 mole % and for the repeat units of structure (IIb) from about 20 mole % to about 60 mole %, and wherein the individual values of the mole % for the repeat units of structures (Ib) and (IIb) are selected from their respective ranges to add up to 100 mole % of the total moles of repeat units of structures (Ib) and (IIb); and further, said oligo random copolymer b-1) has a $T_g$ which is from about 0° C. to about 80° C., and has an $M_n$ which is from about 1000 g/mole to about 5000 g/mole, and has a polydispersity from about 1.3 to about 1.8,

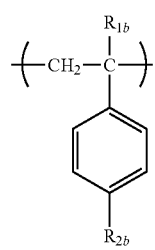

(Ib)

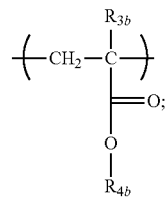

(IIb)

b-2) is an oligo diblock copolymer of block A-b) and block B-b), having an $M_n$ from about 1,000 to 35,000, and a polydispersity from 1.0 to about 1.1, wherein block A-b) is a random copolymer of repeat units having structures (III), and (IV), and block B-b) is a random copolymer of repeat units having structures (V), and (VI), and $R_5$, $R_7$, $R_9$, and $R_{11}$, are independently selected from H or a C-1 to C-4 alkyl, $R_6$ is a C-7 to C-10 linear alkyl, $R_8$ is a C-1 to C-4 alkyl, $R_{10}$ is a C-1 to C-4 alkyl, $R_{12}$ and $R_{13}$ are individually selected from a C-2 to C-5 alkylene, and $R_{14}$ is a C-1 to C-4 alkyl, and said oligo diblock copolymer b-2) has a $T_g$ which has a value from about 0° C. to about 95° C.,

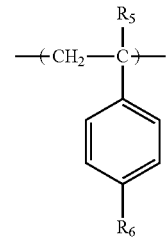

(III)

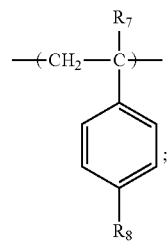

(IV)

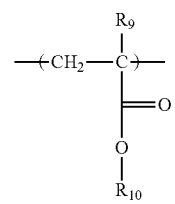

(V)

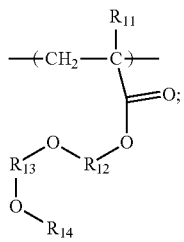

(IV)

and b-3) is an oligo diblock copolymer of block A-c), with repeat units having structure (Ic), and a block B-c), with repeat units having structure (IIc), wherein $R_{1c}$ and $R_{3c}$ are independently selected from H or a C-1 to C-4 alkyl, $R_{2c}$ is H or a C-1 to C-8 alkyl, $R_{4c}$ is a C-1 to C-8 alkyl, and the mole % values, based on the total moles of repeat units of structures (Ic) and (IIc), are for the repeat units of structure (Ic) from about 36 mole % to about 74 mole % and for the repeat units of structure (IIc) from about 26 mole % to about 64 mole %, and the individual values of the mole % for the repeat units of structures (Ic) and (IIc) are selected from their respective ranges to add up to 100 mole % of the total moles of repeat units of structures (Ic) and (IIc), and said oligo diblock copolymer b-3) has an $M_n$ from about 1000 g/mole to 23,400 g/mole, a polydispersity from about 1.0 to about 1.1, and a $T_g$ from about 0° C. to 90° C.,

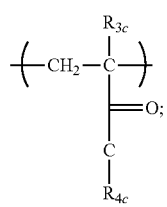
(IIc)

c) is a spin casting organic solvent.

43. A composition comprising components a), b) and c), wherein a) is a block copolymer component or blend of at least two block copolymers, b) is a low $T_g$ additive selected from the group consisting of an oligo random copolymer b-1), made by radical polymerization using an (E)-2,2'-(diazene-1,2-diyl)bis(2-alkylpropanenitrile radical initiator and an alkyl thiol chain transfer agent, an oligo diblock copolymer b-2), made by anionic polymerization using an alkyl lithium initiator, wherein;

b-1) is an oligo random copolymer, of two repeat units, which have structure (Ib) and structure (IIb), wherein $R_{1b}$ and $R_{3b}$ are independently selected from H or a C-1 to C-4 alkyl, $R_{2b}$ is H or a C-1 to C-8 alkyl, $R_{4b}$ is a C-1 to C-8 alkyl, and the mole % values, based on the total moles of repeat units of structures (Ib) and (IIb), are for the repeat units of structure (Ib) from about 40 mole % to about 80 mole % and for the repeat units of structure (IIb) from about 20 mole % to about 60 mole %, and wherein the individual values of the mole % for the repeat units of structures (Ib) and (IIb) are selected from their respective ranges to add up to 100 mole % of the total moles of repeat units of structures (Ib) and (IIb); and further said oligo random copolymer b-1) has a $T_g$ which is from about 0° C. to about 80° C., and has an $M_n$ which is from about 1000 g/mole to about 8000 g/mole, and has a polydispersity from about 1.3 to about 1.8, and where said

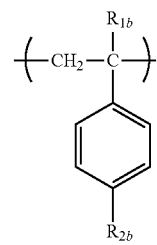
(Ib)

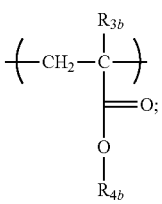
(IIb)

b-2) is an oligo diblock copolymer of block A-b) and block B-b), having an $M_n$ from about 1,000 to 35,000, and a polydispersity from 1.0 to about 1.1, wherein block A-b) is a random copolymer of repeat units having structures (III), and (IV), and block B-b) is a random copolymer of repeat units having structures (V), and (VI), and $R_5$, $R_7$, $R_9$, and $R_{11}$, are independently selected from H or a C-1 to C-4 alkyl, $R_6$ is a C-7 to C-10 linear alkyl, $R_8$ is a C-1 to C-4 alkyl, $R_{10}$ is a C-1 to C-4 alkyl, $R_{12}$ and $R_{13}$ are individually selected from a C-2 to C-5 alkylene, and $R_{14}$ is a C-1 to C-4 alkyl, and said oligo diblock copolymer b-2) has a $T_g$ which has a value from about 0° C. to about 95° C.,

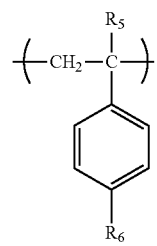
(III)

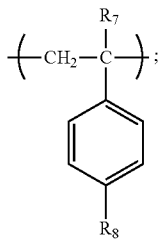
(IV)

-continued

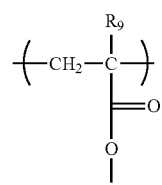
(V)

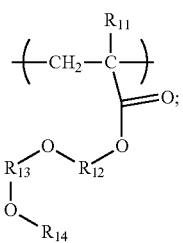
(VI)

and
c) is a spin casting organic solvent.

44. A composition comprising components a), b) and c), wherein
a) is a block copolymer component or blend of at least two block copolymers, wherein said block copolymer is a) is a diblock copolymer component selected from the group consisting of diblock copolymer a-2) and a blend of a-1) and a-2), wherein
a-1) is a diblock copolymer of block A), with styrenic repeat units having styrenic structure (I), and block B), having acrylic structure (II), wherein Rand $R_3$ are independently selected from H and C-1 to C-4 alkyl, $R_2$ is H or a C-1 to C-8 alkyl, $R_4$ is a C-1 to C-8 alkyl, and
the mole % values, based on the total moles of repeat units of structures (I) and (II), are for the repeat units of structure (I) from about 40 mole % to about 80 mole % and for the repeat units of structure (II) from about 20 mole % to about 60 mole %,
wherein the individual values of the mole % for the repeat units of structures (I) and (II) are selected from their respective ranges to add up to 100 mole % of the total moles of repeat units of structures (I) and (II), and
said diblock copolymer a-1) has a polydispersity from about 1.0 to about 1.1
has an $M_n$ from 50,000 g/mole to about 150,000 g/mole,

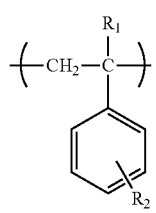
(I)

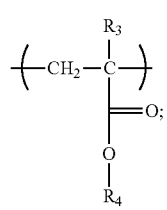
(II)

a-2) is a di-block copolymer of a block A-a), with repeat units having styrenic structure (Ia), and block B-a), with repeat units having acrylic structure (IIa), wherein $R_{1a}$ and $R_{3a}$ are independently selected from H or a C-1 to C-4 alkyl, $R_{2a}$ is H or a C-1 to C-8 alkyl, $C_{4a}$ is a C-1 to C-8 alkyl and,
the mole % values, based on the total moles of repeat units of structures (Ia) and (IIa), are for the repeat units of structure (Ia) from about 40 mole % to about 80 mole % and for the repeat units of structure (IIa) from about 20 mole % to about 60 mole %, and
wherein the individual values of the mole % for the repeat units of structures (Ia) and (IIa) are selected from their respective ranges to add up to 100 mole % of the total moles of repeat units of structures (Ia) and (IIa), and
said diblock copolymer a-2) has a polydispersity from about 1.0 to about 1.03,
has an $M_n$ from about 30,000 g/mole to about 90,000 g/mole,

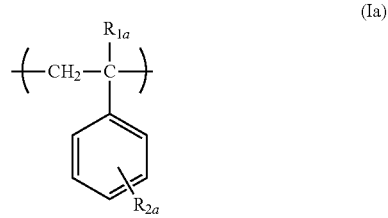
(Ia)

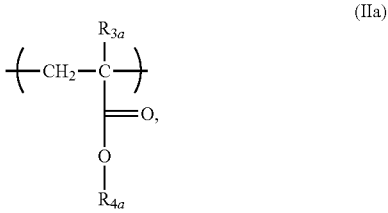
(IIa)

b) is a low $T_g$ additive selected from the group consisting of
an oligo random copolymer b-1),
an oligo diblock copolymer b-2),
an oligo diblock copolymer b-3) and
mixture thereof, wherein;
b-1) is an oligo random copolymer, of two repeat units, which have structure (Ib) and structure (IIb), wherein $R_{1b}$ and $R_{3b}$ are independently selected from H or a C-1 to C-4 alkyl, $R_{2b}$ is H or a C-1 to C-8 alkyl, $R_{4b}$ is a C-1 to C-8 alkyl, and
the mole % values, based on the total moles of repeat units of structures (Ib) and (IIb), are for the repeat units of structure (Ib) from about 40 mole % to about 80 mole % and for the repeat units of structure (IIb) from about 20 mole % to about 60 mole %, and
wherein the individual values of the mole % for the repeat units of structures (Ib) and (IIb) are selected from their respective ranges to add up to 100 mole % of the total moles of repeat units of structures (Ib) and (IIb); and further
said oligo random copolymer b-1) has a $T_g$ which is from about 0° C. to about 80° C., and has an $M_n$ which is from about 1000 g/mole to about 8,000 g/mole, and has a polydispersity from about 1.3 to about 1.8,

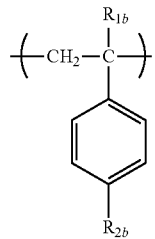
(Ib)

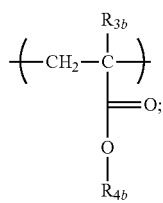
(IIb)

b-2) is an oligo diblock copolymer of block A-b) and block B-b), having an $M_n$ from about 1,000 to 35,000, and a polydispersity from 1.0 to about 1.1, wherein block A-b) is a random copolymer of repeat units having structures (III), and (IV), and block B-b) is a random copolymer of repeat units having structures (V), and (VI), and $R_5$, $R_7$, $R_9$, and $R_{11}$, are independently selected from H or a C-1 to C-4 alkyl, $R_6$ is a C-7 to C-10 linear alkyl, $R_8$ is a C-1 to C-4 alkyl, $R_{10}$ is a C-1 to C-4 alkyl, $R_{12}$ and $R_{13}$ are individually selected from a C-2 to C-5 alkylene, and $R_{14}$ is a C-1 to C-4 alkyl, and said oligo diblock copolymer b-2) has a $T_g$ which has a value from about 0° C. to about 95° C.,

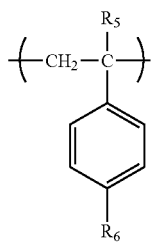
(III)

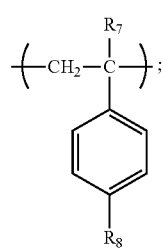
(IV)

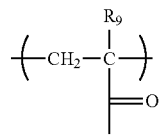
(V)

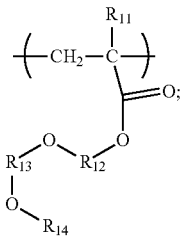
(VI)

and b-3) is an oligo diblock copolymer of block A-c), with repeat units having structure (Ic), and a block B-c), with repeat units having structure (IIc), wherein $R_{1c}$ and $R_{3c}$ are independently selected from H or a C-1 to C-4 alkyl, $R_{2c}$ is H or a C-1 to C-8 alkyl, $R_{4c}$ is a C-1 to C-8 alkyl, and the mole % values, based on the total moles of repeat units of structures (Ic) and (IIc), are for the repeat units of structure (Ic) from about 36 mole % to about 74 mole % and for the repeat units of structure (IIc) from about 26 mole % to about 64 mole %, and the individual values of the mole % for the repeat units of structures (Ic) and (IIc) are selected from their respective ranges to add up to 100 mole % of the total moles of repeat units of structures (Ic) and (IIc), and said oligo diblock copolymer b-3) has an $M_n$ from about 1000 g/mole to 23,400 g/mole, a polydispersity from about 1.0 to about 1.1, and a $T_g$ from about 0° C. to 90° C.,

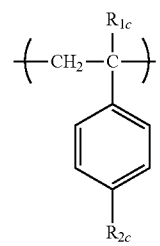
(Ic)

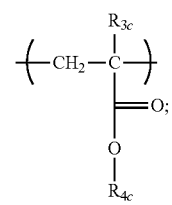
(IIc)

c) is a spin casting organic solvent.

45. A composition comprising components a), b) and c), wherein a) is a block copolymer component or blend of at least two block copolymers, b) is a low $T_g$ additive which is an an oligo diblock copolymer b-2), wherein;

b-2) is an oligo diblock copolymer of block A-b) and block B-b), having an $M_n$ from about 1,000 to 35,000, and a polydispersity from 1.0 to about 1.1, wherein block A-b) is a random copolymer of repeat units having structures (III), and (IV), and block B-b) is a random copolymer of repeat units having structures (V), and (VI), and $R_5$, $R_7$, $R_9$, and $R_{11}$, are independently selected from H or a C-1 to C-4 alkyl, $R_6$ is a C-7 to C-10 linear alkyl, $R_8$ is a C-1 to C-4 alkyl, $R_{10}$ is a C-1 to C-4 alkyl, $R_{12}$ and $R_{13}$ are individually selected from a C-2 to C-5 alkylene, and $R_{14}$ is a C-1 to C-4 alkyl, and said oligo diblock copolymer b-2) has a $T_g$ which has a value from about 0° C. to about 95° C.,

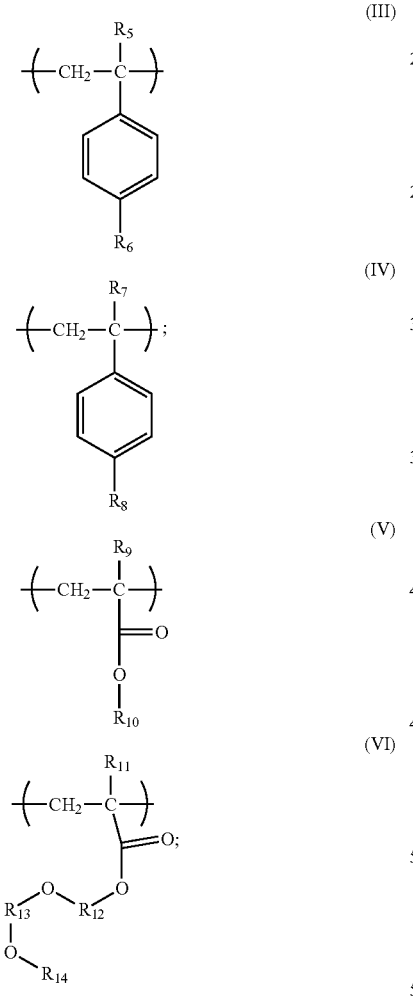

and c) is a spin casting organic solvent.

46. The composition of claim 43, where said low $T_g$ additive is said oligo random copolymer b-1).

47. The composition of claim 43, where said low $T_g$ additive is said oligo random copolymer b-2).

48. The composition of claim 43, wherein said component a) is an ABA triblock copolymer component selected from the group consisting of ABA triblock copolymer a-1t), a ABA triblock copolymer a-2t) and a blend of ABA triblock polymer a-1t) and ABA triblock copolymer a-2t), wherein a-1t) is an ABA triblock copolymer, comprising a middle B) styrenic block segment of repeat units having styrenic structure (I), and two end acrylic block A) segments of equal length having structure (II), wherein $R_1$ and $R_3$ are independently selected from H and C-1 to C-4 alkyl, $R_2$ is H or a C-1 to C-8 alkyl, $R_4$ is a C-1 to C-8 alkyl, and the mole % values, based on the total moles of repeat units of structures (I) and (II), are for the repeat units of structure (I) from about 40 mole % to about 80 mole % and for the repeat units of structure (II) from about 20 mole % to about 60 mole %, wherein the individual values of the mole % for the repeat units of structures (I) and (II) are selected from their respective ranges to add up to 100 mole % of the total moles of repeat units of structures (I) and (II), and said triblock copolymer a-1t) has a polydispersity from about 1.0 to about 1.1 and has an $M_n$ from about 70,000 g/mole to about 350,000 g/mole,

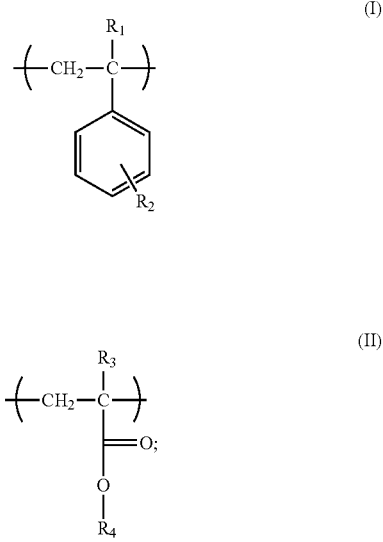

a-2t) is an ABA triblock copolymer, comprising a middle B) block segment of repeat units having styrenic structure (Ia), and two end block B) segments of equal length having acrylic structure (IIa), wherein $R_{1a}$ and $R_{3a}$ are independently selected from H and C-1 to C-4 alkyl, $R_{2a}$ is H or a C-1 to C-8 alkyl, $R_{4a}$ is a C-1 to C-8 alkyl, the mole % values, based on the total moles of repeat units of structures (Ia) and (IIa), are for the repeat units of structure (Ia) from about 40 mole % to about 80 mole % and for the repeat units of structure (IIa) from about 20 mole % to about 60 mole %, and wherein the individual values of the mole % for the repeat units of structures (Ia) and (IIa) are selected from their respective ranges to add up to 100 mole % of the total moles of repeat units of structures (Ia) and (IIa), and said triblock copolymer a-2t) has a polydispersity from about 1.0 to about 1.1, has an $M_n$ from about 70,000 g/mole to about 350,000 g/mol,

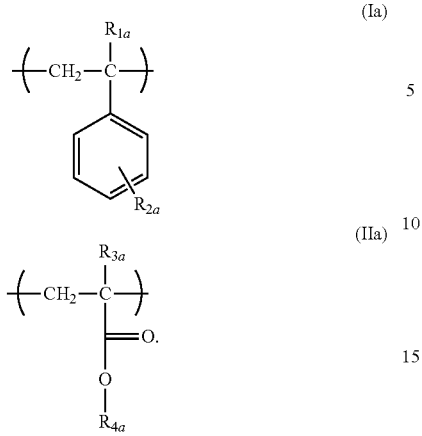

(Ia)

(IIa)

49. The composition of claim 43, wherein component a) is a triblock copolymer selected from a triblock copolymer of structure (ABA-1), a triblock copolymer of structure (ABA-2) and a mixture of these two block copolymers, wherein mt, mta, nt and nta are the number of repeat units, $R_{1s}$, $R_{1sa}$, $R_{2s}$, and $R_{2sa}$ are independently selected from hydrogen, a C-1 to C-8 alkyl, —N($R_{3s}$)$_2$, —O$R_{4s}$, and Si($R_{5s}$)$_3$, wherein $R_{3s}$, $R_{4s}$ and $R_{5s}$ are independently selected from a C-1 to C-4 alkyl, 50. The composition of claim 43, wherein a) is a diblock copolymer component selected from the group consisting of diblock copolymer a-1), diblock copolymer a-2) and a blend of a-1) and a-2), wherein a-1) is a diblock copolymer of block A), with styrenic repeat units having styrenic structure (I), and block B), having acrylic structure (II), wherein $R_1$ and $R_3$ are independently selected from H and C-1 to C-4 alkyl, $R_2$ is H or a C-1 to C-8 alkyl, $R_4$ is a C-1 to C-8 alkyl, and the mole % values, based on the total moles of repeat units of structures (I) and (II), are for the repeat units of structure (I) from about 40 mole % to about 80 mole % and for the repeat units of structure (II) from about 20 mole % to about 60 mole %, wherein the individual values of the mole % for the repeat units of structures (I) and (II) are selected from their respective ranges to add up to 100 mole % of the total moles of repeat units of structures (I) and (II), and said diblock copolymer a-1) has a polydispersity from about 1.0 to about 1.1

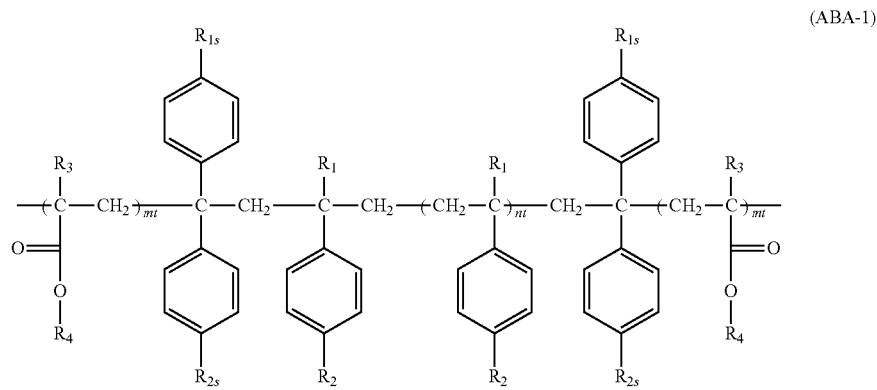

(ABA-1)

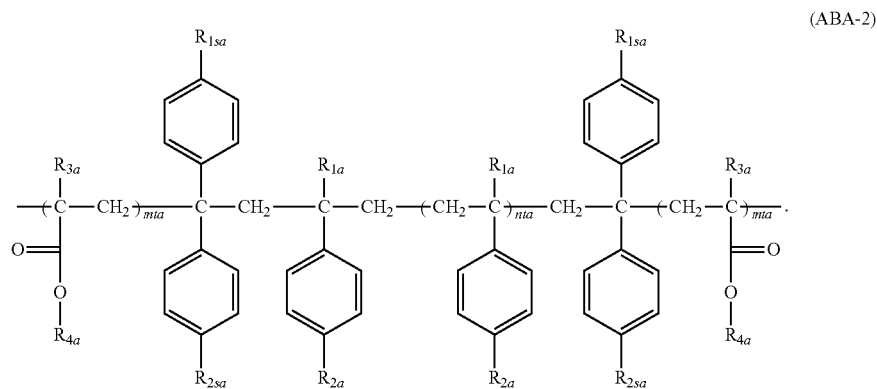

(ABA-2)

has an $M_n$ from 50,000 g/mole to about 150,000 g/mole,

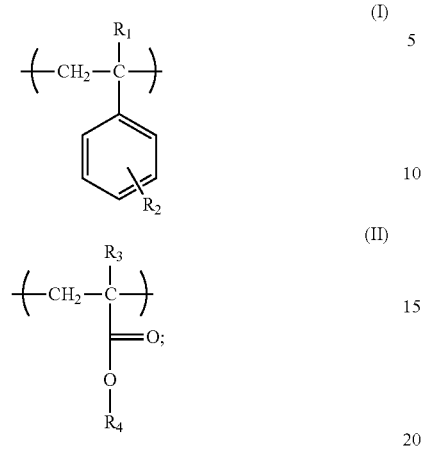

a-2) is a di-block copolymer of a block A-a), with repeat units having styrenic structure (Ia), and block B-a), with repeat units having acrylic structure (IIa), wherein $R_{1a}$ and $R_{3a}$ are independently selected from H or a C-1 to C-4 alkyl, $R_{2a}$ is H or a C-1 to C-8 alkyl, $C_{4a}$ is a C-1 to C-8 alkyl and, the mole % values, based on the total moles of repeat units of structures (Ia) and (IIa), are for the repeat units of structure (Ia) from about 40 mole % to about 80 mole % and for the repeat units of structure (IIa) from about 20 mole % to about 60 mole %, and wherein the individual values of the mole % for the repeat units of structures (Ia) and (IIa) are selected from their respective ranges to add up to 100 mole % of the total moles of repeat units of structures (Ia) and (IIa), and said diblock copolymer a-2) has a polydispersity from about 1.0 to about 1.1, has an $M_n$ from about 30,000 g/mole to about 90,000 g/mole,

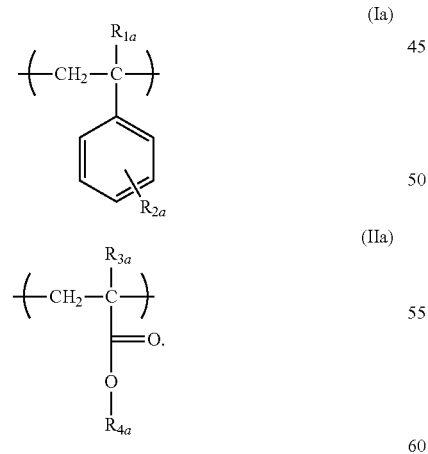

51. The composition of claim 45 wherein said block copolymer component a) is selected from the group consisting of a diblock copolymer component selected from the group consisting of diblock copolymer a-1), diblock copolymer a-2) and a blend of a-1) and a-2), wherein a-1) is a diblock copolymer of block A), with styrenic repeat units having styrenic structure (I), and block B), having acrylic structure (II), wherein $R_1$ and $R_3$ are independently selected from H and C-1 to C-4 alkyl, $R_2$ is H or a C-1 to C-8 alkyl, $R_4$ is a C-1 to C-8 alkyl, and the mole % values, based on the total moles of repeat units of structures (I) and (II), are for the repeat units of structure (I) from about 40 mole % to about 80 mole % and for the repeat units of structure (II) from about 20 mole % to about 60 mole %, wherein the individual values of the mole % for the repeat units of structures (I) and (II) are selected from their respective ranges to add up to 100 mole % of the total moles of repeat units of structures (I) and (II), and said diblock copolymer a-1) has a polydispersity from about 1.0 to about 1.1 has an $M_n$ from 50,000 g/mole to about 150,000 g/mole,

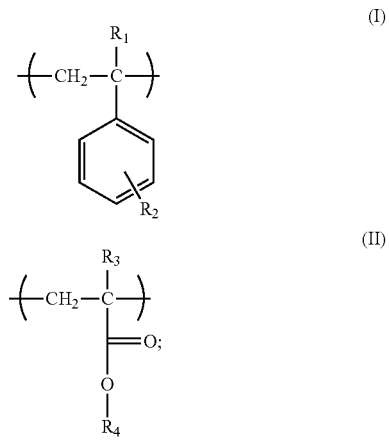

a-2) is a di-block copolymer of a block A-a), with repeat units having styrenic structure (Ia), and block B-a), with repeat units having acrylic structure (IIa), wherein $R_{1a}$ and $R_{3a}$ are independently selected from H or a C-1 to C-4 alkyl, $R_{2a}$ is H or a C-1 to C-8 alkyl, $C_{4a}$ is a C-1 to C-8 alkyl and, the mole % values, based on the total moles of repeat units of structures (Ia) and (IIa), are for the repeat units of structure (Ia) from about 40 mole % to about 80 mole % and for the repeat units of structure (IIa) from about 20 mole % to about 60 mole %, and wherein the individual values of the mole % for the repeat units of structures (Ia) and (IIa) are selected from their respective ranges to add up to 100 mole % of the total moles of repeat units of structures (Ia) and (IIa), and said diblock copolymer a-2) has a polydispersity from about 1.0 to about 1.1, has an $M_n$ from about 30,000 g/mole to about 90,000 g/mole, and

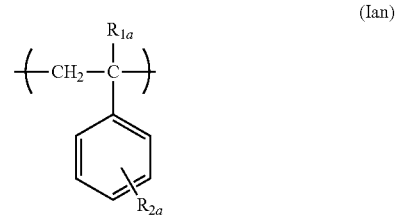

-continued

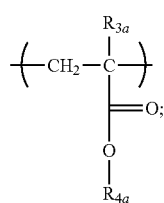
(IIa)

an ABA triblock copolymer component selected from the group consisting of ABA triblock copolymer a-1t), a ABA triblock copolymer a-2t) and a blend of ABA triblock polymer a-1t) and ABA triblock copolymer a-2t), wherein a-1t) is an ABA triblock copolymer, comprising a middle B) styrenic block segment of repeat units having styrenic structure (I), and two end acrylic block A) segments of equal length having structure (II), wherein $R_1$ and $R_3$ are independently selected from H and C-1 to C-4 alkyl, $R_2$ is H or a C-1 to C-8 alkyl, $R_4$ is a C-1 to C-8 alkyl, and the mole % values, based on the total moles of repeat units of structures (I) and (II), are for the repeat units of structure (I) from about 40 mole % to about 80 mole % and for the repeat units of structure (II) from about 20 mole % to about 60 mole %, wherein the individual values of the mole % for the repeat units of structures (I) and (II) are selected from their respective ranges to add up to 100 mole % of the total moles of repeat units of structures (I) and (II), and said triblock copolymer a-1t) has a polydispersity from about 1.0 to about 1.1 and has an $M_n$ from about 70,000 g/mole to about 350,000 g/mole,

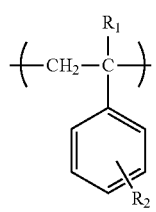
(I)

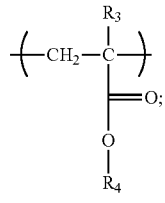
(II)

a-2t) is an ABA triblock copolymer, comprising a middle B) block segment of repeat units having styrenic structure (Ia), and two end block B) segments of equal length having acrylic structure (IIa), wherein $R_{1a}$ and $R_{3a}$ are independently selected from H and C-1 to C-4 alkyl, $R_{2a}$ is H or a C-1 to C-8 alkyl, $R_{4a}$ is a C-1 to C-8 alkyl, the mole % values, based on the total moles of repeat units of structures (Ia) and (IIa), are for the repeat units of structure (Ia) from about 40 mole % to about 80 mole % and for the repeat units of structure (IIa) from about 20 mole % to about 60 mole %, and wherein the individual values of the mole % for the repeat units of structures (Ia) and (IIa) are selected from their respective ranges to add up to 100 mole % of the total moles of repeat units of structures (Ia) and (IIa), and said triblock copolymer a-2t) has a polydispersity from about 1.0 to about 1.1, has an $M_n$ from about 70,000 g/mole to about 350,000 g/mol,

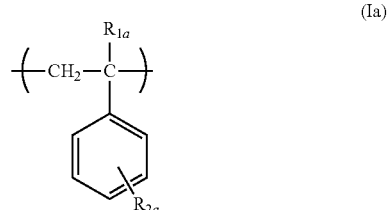
(Ia)

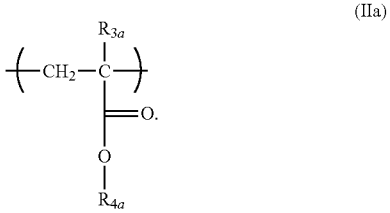
(IIa)

* * * * *